US012469772B2

(12) United States Patent
Bautista, Jr. et al.

(10) Patent No.: US 12,469,772 B2
(45) Date of Patent: Nov. 11, 2025

(54) DIE ATTACH FILM DIE PAD ISOLATION FOR SEMICONDUCTOR DEVICES

(71) Applicant: Texas Instruments Incorporated, Dallas, TX (US)

(72) Inventors: Jesus Bajo Bautista, Jr., Baguio City (PH); Jeniffer Otero Aspuria, Baguio City (PH); Jezreel Duane Caluza Aquino, Baguio City (PH); Francis Masiglat de Vera, Baguio City (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 571 days.

(21) Appl. No.: 17/828,947

(22) Filed: May 31, 2022

(65) Prior Publication Data

US 2023/0386979 A1     Nov. 30, 2023

(51) Int. Cl.
*H01L 23/495* (2006.01)
*H01L 21/78* (2006.01)
*H01L 23/00* (2006.01)
*H01L 23/31* (2006.01)

(52) U.S. Cl.
CPC ........ *H01L 23/49513* (2013.01); *H01L 21/78* (2013.01); *H01L 23/3107* (2013.01); *H01L 24/32* (2013.01); *H01L 24/48* (2013.01); *H01L 24/73* (2013.01); *H01L 2224/32245* (2013.01); *H01L 2224/48245* (2013.01); *H01L 2224/73265* (2013.01)

(58) Field of Classification Search
CPC ............... H01L 23/49513; H01L 21/78; H01L 23/3107; H01L 24/32; H01L 24/48; H01L 24/73; H01L 2224/32245; H01L 2224/48245; H01L 2224/73265; H01L 23/4952; H01L 23/49541; H01L 23/49562; H01L 2221/68336; H01L 21/561; H01L 24/27; H01L 24/29; H01L 24/83; H01L 21/6836
USPC ......................................... 257/676
See application file for complete search history.

(56) References Cited

U.S. PATENT DOCUMENTS

| 6,407,360 | B1* | 6/2002 | Choo | B28D 5/00 |
| | | | | 219/121.68 |
| 6,498,319 | B1* | 12/2002 | Matsumoto | H01L 21/481 |
| | | | | 219/121.72 |
| 9,418,974 | B2* | 8/2016 | Ng | H01L 25/0657 |

(Continued)

*Primary Examiner* — Caleb E Henry
(74) *Attorney, Agent, or Firm* — Dawn Jos; Frank D. Cimino

(57) ABSTRACT

In a described example, an apparatus includes: a semiconductor die having a device side surface and an opposing backside surface, the backside surface mounted to a die pad of a lead frame using a die attach film; bond pads overlying the device side surface of the semiconductor die; bond wires electrically coupling the bond pads to leads of the lead frame spaced from the die pad; and mold compound covering the semiconductor die, the bond wires, and portions of the lead frame, where portions of the leads are exposed from the mold compound to form terminals of the packaged semiconductor device. The die attach film has a partially cut die attach film layer with a cut side edge normal to the backside surface, and the die attach film has an uncut die attach film layer with a torn side edge normal to the backside surface.

16 Claims, 20 Drawing Sheets

(56) References Cited

U.S. PATENT DOCUMENTS

| | | | |
|---|---|---|---|
| 2008/0238957 A1* | 10/2008 | Hayashi | B41J 2/17509 347/85 |
| 2008/0239029 A1* | 10/2008 | Hayashi | H10K 71/135 347/3 |
| 2008/0297550 A1* | 12/2008 | Igarashi | B41J 2/2132 347/12 |
| 2009/0033700 A1* | 2/2009 | Kusumoto | B41J 2/175 347/12 |
| 2009/0058915 A1* | 3/2009 | Hayashi | B41J 2/175 347/17 |
| 2009/0058925 A1* | 3/2009 | Hayashi | B41J 2/16532 347/30 |
| 2010/0255636 A1* | 10/2010 | Schwab | H01L 24/27 438/109 |
| 2014/0272322 A1* | 9/2014 | Lee | H01L 21/6715 118/301 |
| 2015/0054145 A1* | 2/2015 | How | H01L 23/49548 257/676 |
| 2015/0206829 A1* | 7/2015 | Au | H01L 23/49541 257/670 |
| 2016/0071743 A1* | 3/2016 | How | H01L 21/4821 438/107 |
| 2016/0190097 A1* | 6/2016 | Luan | H01L 25/50 438/107 |
| 2016/0276589 A1* | 9/2016 | Lee | H10K 71/80 |
| 2017/0040286 A1* | 2/2017 | Luan | H01L 24/83 |
| 2018/0233707 A1* | 8/2018 | Mine | F16C 29/008 |
| 2019/0217414 A1* | 7/2019 | Hong | B23K 37/047 |
| 2019/0364671 A1* | 11/2019 | Mihotani | H05K 3/323 |

* cited by examiner

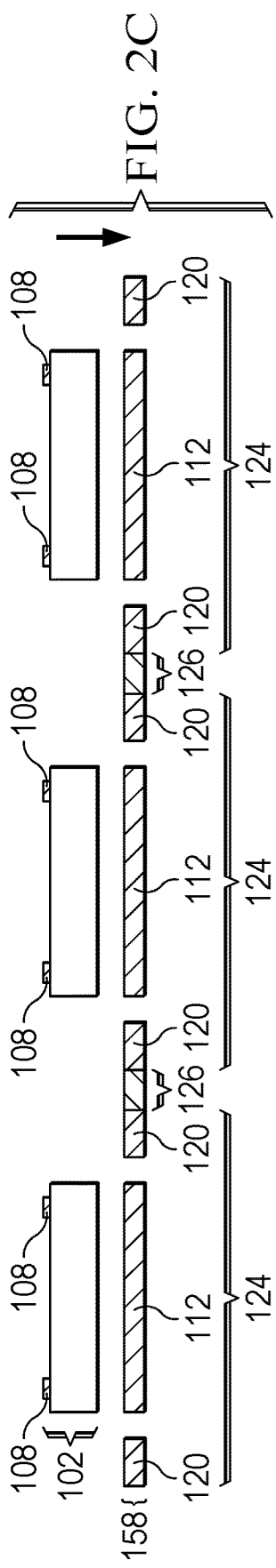
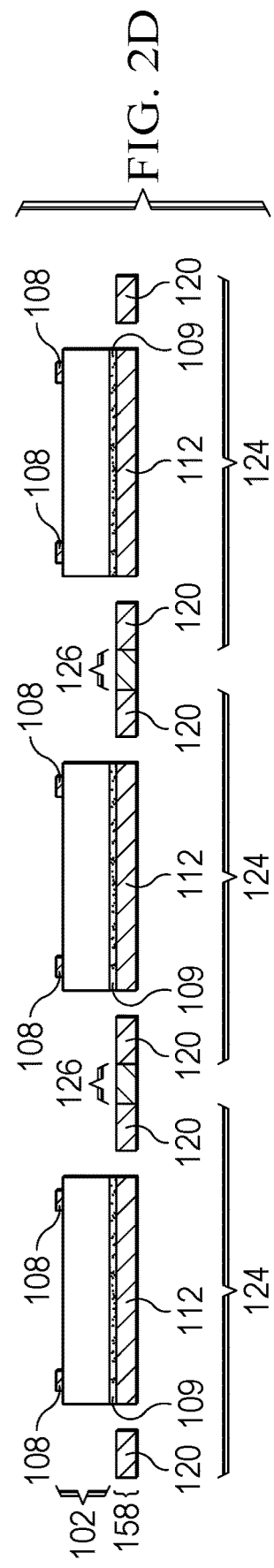

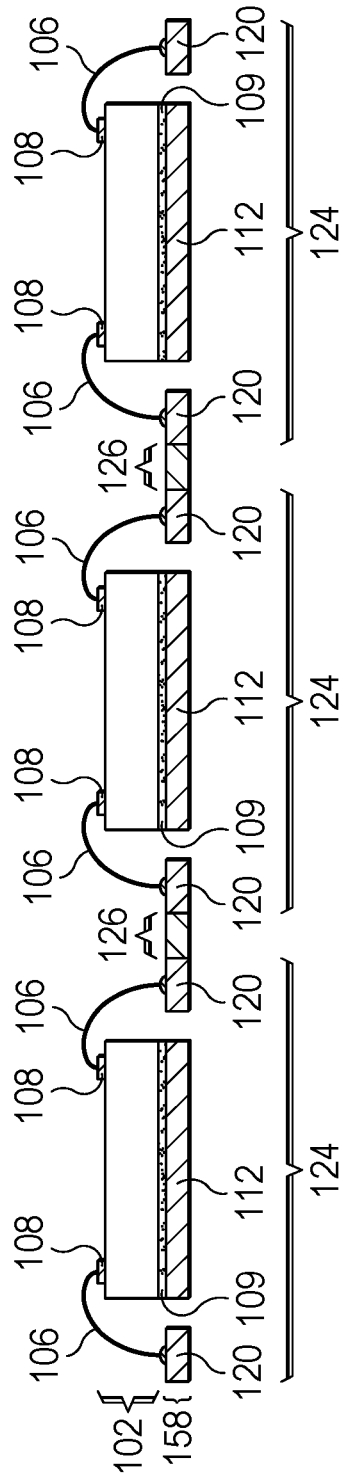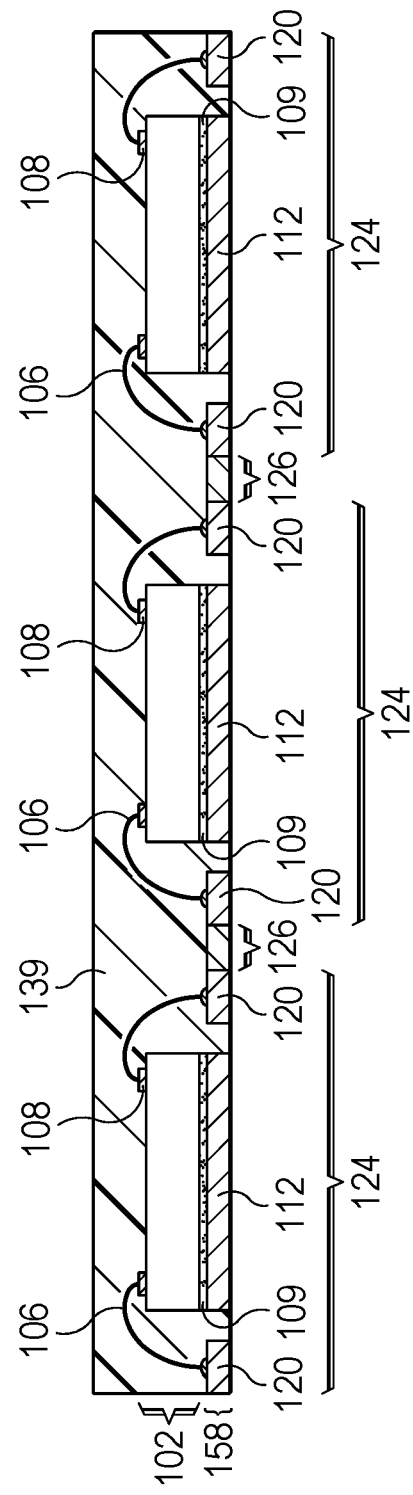

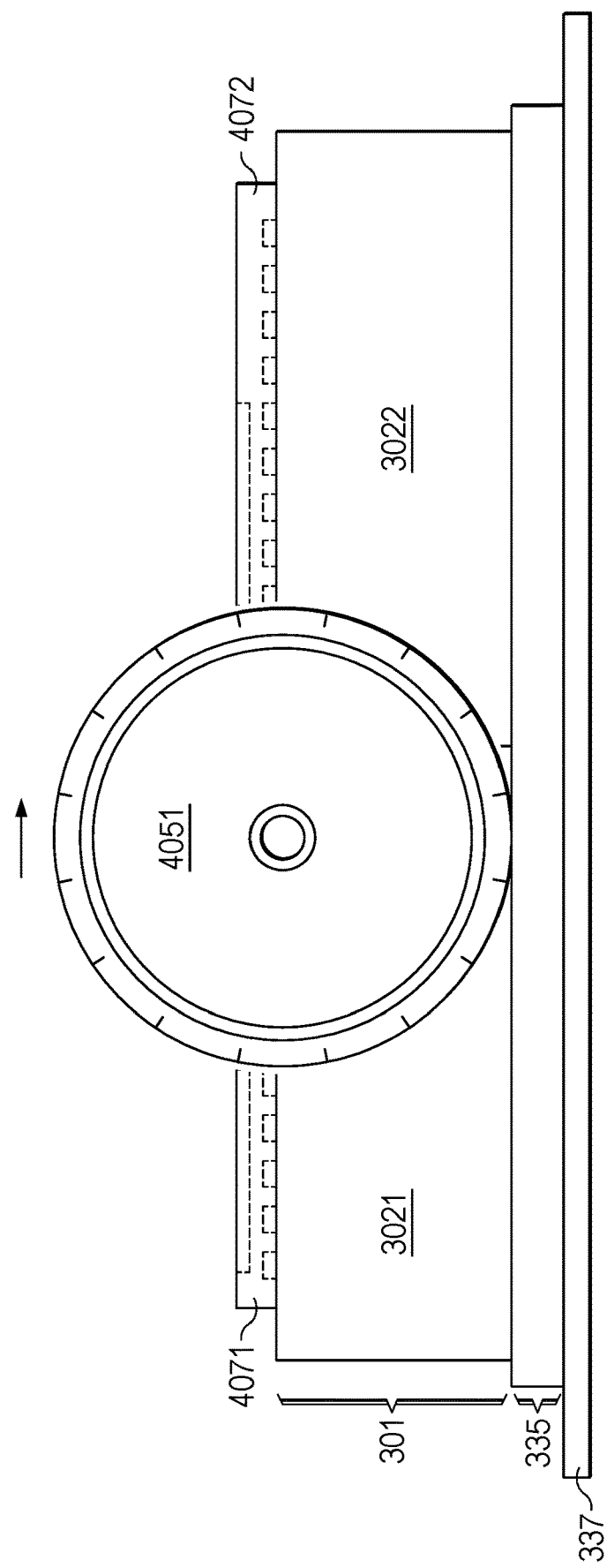

DIE ATTACH FILM DIE PAD ISOLATION FOR SEMICONDUCTOR DEVICES

TECHNICAL FIELD

This relates generally to packaged semiconductor devices using semiconductor dies separated in a dicing operation, and more particularly to separating individual semiconductor dies from a semiconductor wafer and for isolating semiconductor dies.

BACKGROUND

In producing semiconductor devices, a semiconductor wafer is processed in a manufacturing facility to form individual unit semiconductor devices on a surface. Doping, implantation, thermal anneal, formation of dielectrics, and formation of conductors including patterning, plating, sputtering, polishing, and passivation are some of the steps used to fabricate a semiconductor device. During the semiconductor wafer processing, scribe lanes are defined between the unit devices, so that the individual semiconductor dies can be separated from one another in a dicing operation after the semiconductor wafer processing is complete.

In a laser dicing operation, a laser is focused at a depth beneath a surface of the semiconductor wafer in a scribe lane, and a stress area is created by application of laser energy to the crystalline semiconductor wafer. After the laser passes along the scribe lanes, the wafer can be diced by pulling on the wafer to open the wafer by causing fractures along the laser affected areas in the scribe lanes. However, because the laser dicing affects the semiconductor wafer without cutting through the metallization and dielectric layers that are formed over the device side surface of the semiconductor wafer, the laser dicing operation may fail to separate all of the semiconductor devices from one another, reducing yields.

In a mechanical dicing operation, a saw is used. The saw is used to make cuts along the scribe lanes of the semiconductor wafer between the semiconductor devices. During the sawing operation, the semiconductor wafer can be mounted to a removable dicing tape. After the cuts through the semiconductor wafer are made, and through any underlying layers such as a die attach film, the dicing tape can be expanded on a stretching table. As the dicing tape stretches the semiconductor device die are separated from one another along the cuts in the scribe lanes. The mechanical dicing operation cuts through metallization layers formed over the device side surface of the semiconductor safer, and the individual device dies will separate one from another completely. In a mechanical dicing operation, chipping often occurs at the backside of the semiconductor wafer, along the bottom edge of the semiconductor wafer where a die attach film is attached. Semiconductor scrap material, or chips, can become lodged in the die attach film and can extend from the backside of the semiconductor die through the die attach film. When the semiconductor die is subsequently mounted to a die pad of a package substrate such as a lead frame, a current leakage path can form through the chips of semiconductor material, resulting in a short, and increasing leakage currents.

SUMMARY

In a described example, an apparatus includes: a semiconductor die having a device side surface and an opposing backside surface, the backside surface mounted to a die pad of a lead frame using a die attach film; bond pads formed in conductor layers overlying the device side surface of the semiconductor die; bond wires electrically coupling the bond pads to leads of the lead frame spaced from the die pad; and mold compound covering the semiconductor die, the bond wires, and portions of the lead frame, with portions of the leads exposed from the mold compound to form terminals of a packaged semiconductor device. The die attach film has a partially cut layer extending from the backside surface of the semiconductor die, the partially cut layer has a cut side edge that is normal to the backside surface of the semiconductor die, and the die attach film has an uncut die attach film layer between the partially cut die attach film layer and the die pad, the uncut die attach film layer has a torn side edge that is normal to the backside surface of the semiconductor die.

BRIEF DESCRIPTION OF THE DRAWINGS

FIGS. 2A-2G illustrate in projection views and cross-sectional views major steps in manufacturing a packaged semiconductor device.

FIGS. 4B-4G illustrate, in additional cross sectional views, the semiconductor wafer of FIG. 4A after additional process steps are performed including steps using example arrangements.

DETAILED DESCRIPTION

Figure 1:
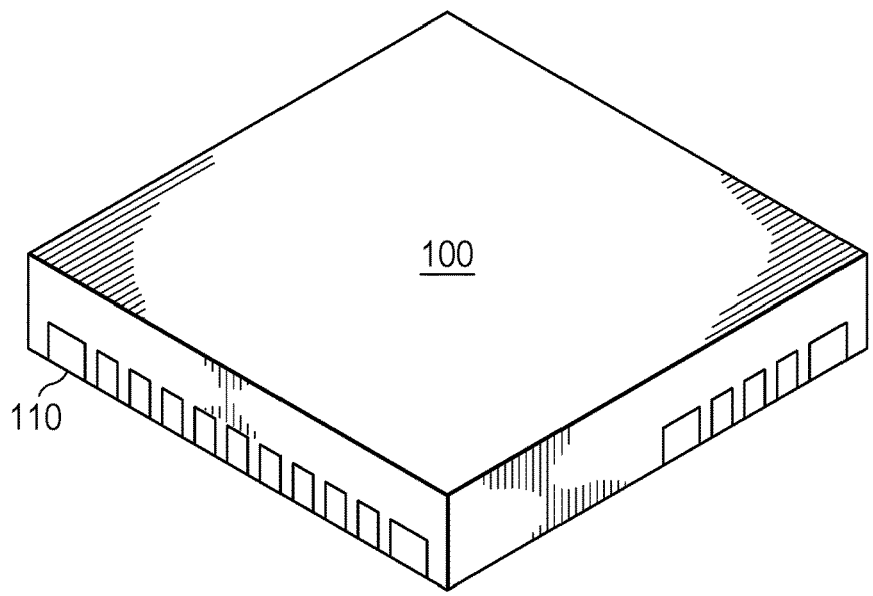
FIG. 1 is a projection view of a packaged electronic device in a quad flat no-leads (QFN) package.

Corresponding numerals and symbols in the different figures generally refer to corresponding parts, unless otherwise indicated. The figures are not necessarily drawn to scale.

Elements are described herein as "coupled." As used herein, the term "coupled" includes elements that are directly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an analog-to-digital (A/D) converter. The semiconductor die can include passive devices such as resistors, inductors, filters, or active devices such as transistors. The semiconductor die can be an integrated circuit with hundreds or thousands of transistors coupled to form a functional circuit, for example a microprocessor or memory device. The semiconductor die can include a passive device such as a sensor, example sensors include photocells, transducers, and charge coupled devices (CCDs), or can be a micro electro-mechanical system (MEMS) device, such as a digital micromirror device (DMD).

The term "packaged semiconductor device" is used herein. A packaged semiconductor device has at least one semiconductor die electronically coupled to terminals and has a package body that protects and covers the semiconductor device die. In some arrangements, multiple semiconductor dies can be packaged together. For example, a power metal oxide semiconductor (MOS) field effect transistor (FET) semiconductor device die and a logic semiconductor device die (such as a gate driver die or controller device die) can be packaged together to from a single packaged electronic device. Additional components such as passives can be included in the packaged electronic device. The semiconductor die is mounted to a substrate that provides conductive leads, a portion of the conductive leads form the terminals for the packaged electronic device. The semiconductor die can be mounted to the substrate with an active device surface facing away from the substrate and a backside surface facing and mounted to the substrate. Alternatively, the semiconductor die can be mounted with the active surface facing the substrate surface and the semiconductor die mounted to the leads of the substrate by conductive columns or solder balls. The packaged semiconductor device can have a package body formed by a thermoset epoxy resin in a molding process, or by the use of epoxy, plastics, or resins that are liquid at room temperature and are subsequently cured. The package body may provide a hermetic package for the packaged electronic device. The package body may be formed in a mold using an encapsulation process, however, a portion of the leads of the substrate are not covered during encapsulation, these exposed lead portions provide the exposed terminals for the packaged semiconductor device.

The term "package substrate" is used herein. A package substrate is a substrate arranged to receive a semiconductor die and to support the semiconductor die in a completed semiconductor package. Package substrates include conductive lead frames, which can be formed from metals such as copper, nickel, palladium, gold, aluminum, steel, stainless steel, and alloys such as Alloy 42 and copper alloy. The lead frames can include a die pad for mounting the semiconductor die, and conductive leads arranged proximate to the die pad. The conductive leads are electrically coupled to bond pads on the semiconductor die using wire bonds, ribbon bonds, or other conductors. The lead frames can be provided in strips or arrays. Dies can be placed on the lead frame strips or arrays, the dies placed on a die pad or on leads (chip on lead) for each packaged device, and die attach or die adhesive can be used to mount the dies to the lead frame die pads or on leads (chip on lead). Wire bonds can couple bond pads on the semiconductor dies to the leads of the lead frames. After the wire bonds are in place, a portion of the substrate, the die, and at least a portion of the die pad can be covered with a protective material such as a mold compound. In the example arrangements, the semiconductor dies are mounted on a die pad for a lead frame using a die attach film to adhere the semiconductor dies to the die pads while isolating the semiconductor dies from the die pads.

Alternative package substrates include pre-molded lead frames (PMLF) and molded interconnect substrates (MIS) for receiving semiconductor dies. These substrates can include dielectrics such as liquid crystal polymer (LCP) or mold compound and conductive portions in the dielectrics. The lead frames can include stamped and partially etched lead frames, in a partially etched lead frame, two levels of metal can be formed by etching a pattern from one side of the metal lead frame, and then from the other side, to form full thickness and partial thickness portions, and in some areas, all of the metal can be etched to form openings through the partial etch lead frames. The package substrate can also be tape-based and film-based substrates carrying conductors; ceramic substrates, laminate substrates with multiple layers of conductors and insulator layers; and printed circuit board substrates of ceramic, fiberglass or resin, or glass reinforced epoxy substrates such as flame retardant glass reinforced epoxy resin (FR4).

In a molding process to package a semiconductor die, thermoset mold compound such as epoxy resin can be used. The material can start as a solid or powder at room temperature, be heated to a liquid state, once liquefied used for molding, and then cured. Transfer molding can be used. Unit molds or block molding can be used, to form the package bodies from mold compound. The devices can be provided in an array of hundreds or even thousands of devices in rows and columns that are molded together. After the molding, the individual packaged devices separated from one another by cutting through the mold compound between them in a sawing operation. Exposed portions of the lead frame leads then form terminals for the packaged semiconductor device. Flip chip mounted devices can be used. In flip chip mounting, conductive posts or columns carrying solder at the ends, solder balls, solder columns, or solder bumps are formed on bond pads of the semiconductor die. The semiconductor die is then oriented with the solder facing a circuit board or substrate. The parts are put in contact and a solder reflow process is used to attach the solder to lands on the substrate, the solder forming a physical attachment and an electrical connection between the substrate and the semiconductor dies. Mold compound or other protective material can cover the semiconductor die, the solder joints, and a portion of the substrate to complete the flip chip package.

The term "scribe lane" is used herein. A scribe lane is a portion of semiconductor wafer that is designated between semiconductor dies. Once processing is finished and the semiconductor devices are complete, the semiconductor devices are separated into individual semiconductor dies by severing the semiconductor wafer along the scribe lanes. The separated dies can then be removed and handled individually for further processing including packaging. This process of removing dies from a wafer is referred to as "singulation" or is sometimes referred to as "dicing." Scribe lanes are arranged on four sides of individual semiconductor dies and when the dies are singulated from one another, rectangular (often square, but not limited to square) semiconductor dies are formed.

The term "saw street" is used herein. A saw street is an area between devices used to allow a saw, such as a mechanical blade, laser or other cutting tool to pass between the devices cutting through material that joins them to separate the devices from one another. This process is another form of singulation. When the molded semiconductor devices are provided in a strip with one device adjacent another device along the strip, the saw streets are parallel to one another and normal to the length of the strip. When the molded semiconductor devices are provided in an array of devices in rows and columns, the saw streets include two groups of parallel saw streets, the two groups are normal to each other and so the saw will traverse the molded electronic devices in two different directions to cut apart the packaged semiconductor devices from one another.

The term "coextensive" is used herein. Two side edges are coextensive when the two side edges have a common extent. In example arrangements, some side edges are described as being coextensive when the two side edges are formed by a common sawing operation.

The term "quad flat no-lead" or "QFN" is used herein for a device package. A QFN package has leads that are coextensive with the sides of a molded package body and the leads are on four sides. Alternative flat no-lead packages may have leads on two sides or on one side. These can be referred to as "small outline no-lead" or "SON" packages. No lead packaged semiconductor devices can be surface mounted to a board. Leaded semiconductor packages can be used with the arrangements where the leads extend away from the package body and are shaped to form a portion for soldering to a board. A dual in line package, or DIP, can be used with the arrangements.

In the arrangements, a semiconductor wafer is processed and semiconductor devices are formed on a device side surface of the semiconductor wafer. The semiconductor wafer is placed on a removable dicing tape. In an example process, the semiconductor wafer is placed with a die attach film between the backside of the semiconductor wafer and the dicing tape. The semiconductor devices are spaced apart by scribe lanes on the semiconductor wafer. In the arrangements, the semiconductor wafer and a portion of the die attach film are cut by a saw to form a partially cut die attach film layer, while another portion of the die attach film forms an uncut die attach film layer. In an example arrangement, a first blade is used to make a first cut through at least a portion of the semiconductor wafer, or alternatively, through the entire thickness of the semiconductor wafer. A second blade then cuts along the same scribe lanes with a second width that is less than the first width, and the second blade cuts into a portion of the die attach film, but not through the entire thickness of the die attach film, forming the partially cut die attach film layer. In another arrangement, a single blade is used to make a cut along the scribe lane that extends through the semiconductor wafer and into a portion of the thickness of the die attach film but not through the entire thickness of the die attach film, forming the partially cut die attach film layer.

The arrangements result in individual dies mounted to a die attach film that includes the partially cut die attach film layer. The semiconductor wafer, with the die attach film and the dicing tape, is then processed in a cooling operation to a temperature below zero degrees C. to cause the die attach film to become brittle. An expansion table is then used to pull the dicing tape in all directions and stretch it, causing the die attach film between the dies to separate, so that individual semiconductor dies and the respective layer of die attach film that is attached to the individual semiconductor dies separate from one another along the scribe lanes, dicing the semiconductor wafer. The individual semiconductor dies can then be mounted to a die pad of a package substrate using the die attach film. The dies are wire bonded or otherwise electrically connected to the package substrate, and covered with a mold compound. Molded semiconductor devices are then sawed to separate the packaged semiconductor devices from one another in another sawing operation, to singulate the packaged semiconductor devices.

Use of the partially cut die attach film layer with the uncut die attach film layer in the arrangements eliminates or substantially prevents current leakage problems that can occur when the semiconductor wafer is mechanically cut using a saw, because chips can occur as the backside of the semiconductor wafer is cut, these semiconductor chips can extend through openings in the die attach film made during dicing, and form shorts or conductive paths between the semiconductor die and the die pad on the package substrate. When the arrangements are used, the uncut die attach film layer isolates the die pad on the package substrate from these chips, even if the chips form, the chips are contained away from the die pad.

FIG. 1 illustrates a packages semiconductor device 100 in a quad flat no lead (QFN) package. The packaged semiconductor device has a body formed from a thermoset mold compound, such as epoxy resin. Other mold compounds, such as resins, epoxies, or plastics can be used. Leads 110 are part of a package substrate that supports a semiconductor die (not visible, as it is obscured by the package) within the package, the leads 110 are exposed from the mold compound and form electrical terminals for the packaged semiconductor device. The packaged semiconductor device can be mounted to a circuit board using surface mount technology (SMT) and solder. Package sizes for semiconductor devices are continually decreasing, and currently can be several millimeters on a side to less than one millimeter on a side, although larger and smaller sizes are also used. Future package sizes will be smaller.

Figure 2A:
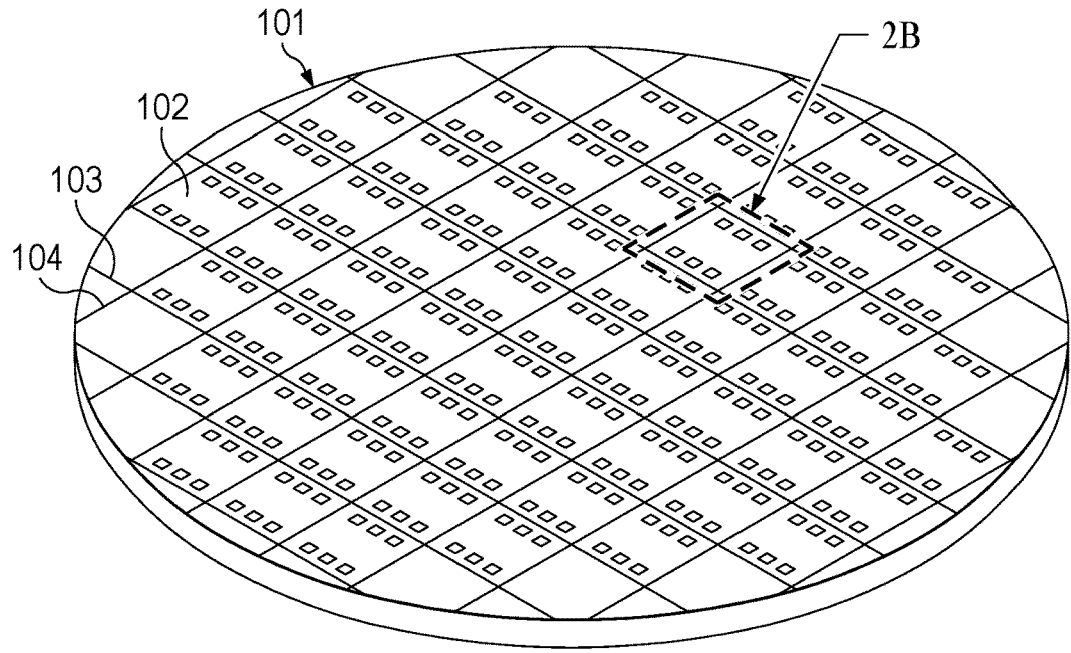
Figure 2B:
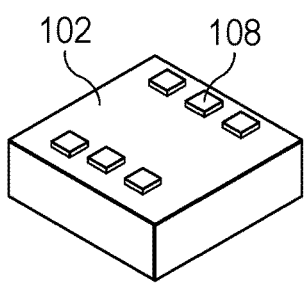

FIGS. 2A-2G illustrate in a series of selected steps methods used for forming packaged semiconductor devices. In FIG. 2A, a device side surface of a semiconductor wafer 101 is shown with an array of semiconductor devices 102 in rows and columns. The semiconductor devices 102 are formed using processes in a semiconductor manufacturing facility, including ion implant doping, anneal, oxidation, dielectric and metal deposition, photolithography, pattern, etch, chemical mechanical polishing (CMP), electroplating, and other processes for making semiconductor devices. A single semiconductor die 102 is shown in FIG. 2B, with bond pads 108, which are conductive pads that are electrically coupled to devices formed in the semiconductor device. Scribe lanes 103 and 104, which are perpendicular to one another and which run in parallel groups across the wafer 101, separate the rows and columns of the completed semiconductor device dies 102, and provide designated areas for dicing the wafer to separate the devices from one another. In example semiconductor processes, test circuitry, passive devices for device characterization, and wafer probe test pads can be formed on the semiconductor wafer in the scribe lane areas, these do not form part of the completed semiconductor dies and can be cut through after wafer level processing and any wafer level testing is complete.

FIG. 2B shows a single semiconductor device die 102 (see the semiconductor wafer 101 in FIG. 1A) in a close up view, with bond pads 108 on a device side surface of the semiconductor device 102. FIG. 2C shows semiconductor device dies 102 after the devices have been singulated from the semiconductor wafer 101. The semiconductor device dies 102 are oriented with bond pads 108 facing away from a package substrate 158. In the illustrated example, the package substrate 158 is a conductive lead frame. Each unit lead frame 124 in a strip or array is spaced from an adjacent unit lead frame by a saw street 126. Leads 120 are spaced from die mount pads 112 in the unit lead frames 124.

In FIG. 2D, another cross-sectional view shows the singulated semiconductor dies 102 mounted on the die mount pads 112 using a die attach 109 such as a die attach film or an adhesive. Some adhesives for die mounting are referred to as "die attach" and these can be used. Die attach 109 can be thermally insulating or thermally conductive. In the arrangements, the die attach used can be a die attach film ("DAF") that is non-conductive.

FIG. 2E in another cross-sectional view, bond pads 108 on the semiconductor dies 102 are electrically connected to leads 120 with conductors 106. In the example of FIG. 2E the conductors 106 are wire bonds. The wire bonds can be formed of copper, gold, aluminum or palladium coated copper bond wire, as example. Ribbon bonds or other conductive connectors can be used.

In FIG. 2F, the semiconductor dies 102, the conductors 106, and portions of the lead frame leads 120 are shown covered with a mold compound 139 such as a filled resin epoxy. The mold compound 139 can be subjected to a thermal cure or can be a thermoset mold compound, heated to liquefy it, and dispensed in a transfer mold as a heated liquid that cures and solidifies as it cools.

Figure 2G:
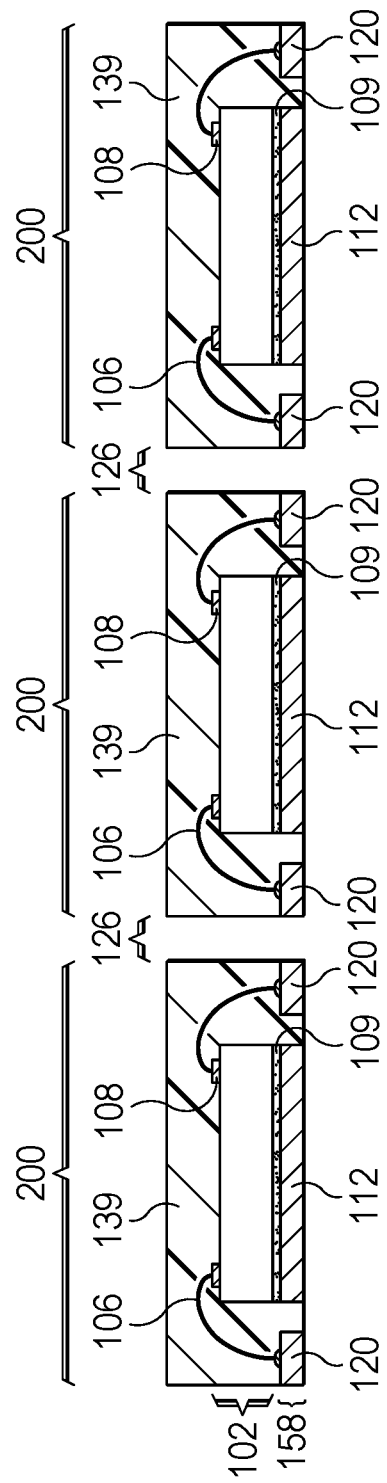

In FIG. 2G, a cross-sectional view shows individual packaged semiconductor devices 200 that are singulated one from one another by cutting through saw streets 126 on the package substrate 158. Each packaged semiconductor device 200 has a package body of mold compound 139, leads 120 that are partially covered by the mold compound 139 and exposed from the mold compound to form terminals for the packaged semiconductor device.

Figure 3A:
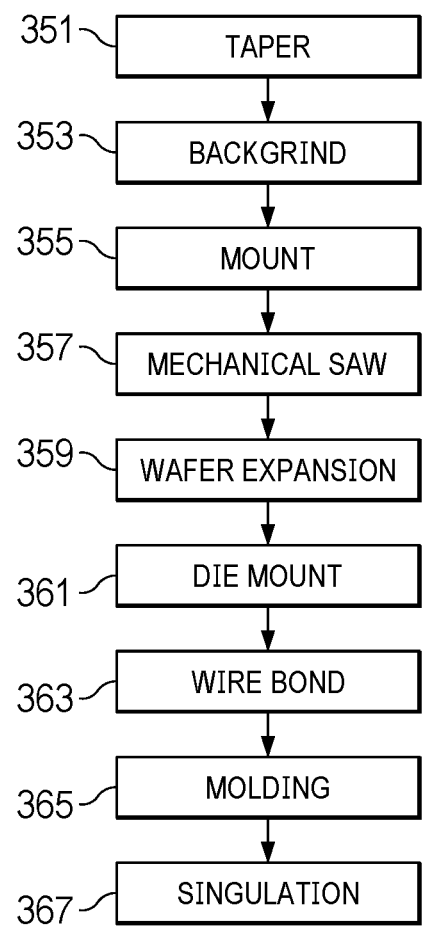
FIG. 3A illustrates, in a flow diagram, selected major steps of manufacturing packaged semiconductor devices, including operations that can incorporate the arrangements.

FIG. 3A illustrates, in a flow diagram, a series of steps used in forming semiconductor dies, which can include the arrangements. In FIG. 3A, at step 351, a semiconductor wafer with semiconductor devices fabricated on a device side is adhered to a backgrinding tape in a taper process. The device side of the semiconductor wafer is contacted by a removable backgrinding tape to support the semiconductor wafer.

At step 353 in FIG. 3A, the semiconductor wafer is subjected to a backgrinding process. Backgrinding thins the semiconductor wafer and the semiconductor devices, making thinner packaged devices possible. At step 355, the semiconductor wafer is then mounted to a dicing tape. The dicing tape can be a circular shape corresponding to the semiconductor wafer size that is supported by a frame. In the arrangements, the dicing tape carries a die attach film that has been previously mounted to it. An example dicing tape with a die attach film useful in the arrangements is supplied by Furukawa Electric Company, Ltd., of Tokyo, Japan. The product is described as a dicing tape with die attach film, and includes a die attach film denoted as die attach film AFN603, and a dicing tape denoted as tape K13. The dicing tape in this example is a UV-release tape. Other dicing tapes and die attach films can be used. The backside surface of the semiconductor wafer is attached to the dicing tape. At step 357, the semiconductor wafer is cut along the scribe lanes using a mechanical saw. As is further explained below, in the arrangements, the mechanical saw makes a partial cut into the die attach film. The arrangements include a single sawing operation example, and a multiple sawing operation example that makes two passes with two different blades, in both example arrangements the saw cuts through the semiconductor wafer and any overlying material on the device side surface, such as dielectrics and conductors, and cuts partially into the die attach film beneath the backside surface of the semiconductor wafer, leaving a partially cut layer and an uncut layer of die attach film. At step 359, the dicing tape is used to separate the semiconductor dies on the semiconductor in a wafer expansion process. By stretching the dicing tape in all directions at once, the semiconductor dies are moved apart from one another, and the die attach film tears along the scribe lanes, due to the partially cut layers that weaken the die attach film in the scribe lanes, allowing the die attach film to tear and break. Each semiconductor die, and its corresponding layer of die attach film, are then left spaced apart from the others but supported by the dicing tape.

At step 361, the dies are removed from the dicing tape, which can be a UV release tape, and are individually mounted to a die pad, as shown in FIG. 2D and described above. At step 363, the wire bonding process takes place, making electrical connections between the bond pads on the semiconductor dies, and the lead frame, as shown in FIG. 2E and described above. At step 365, a molding process covers part of the lead frame, the semiconductor die, and the bond wires with mold compound, leaving portions of the leads exposed from the mold compound to form terminals. This is shown at FIG. 2F and described above. At step 367, the packaged semiconductor devices are cut apart in a singulation process, shown in FIG. 2G and described above.

Figure 3B:
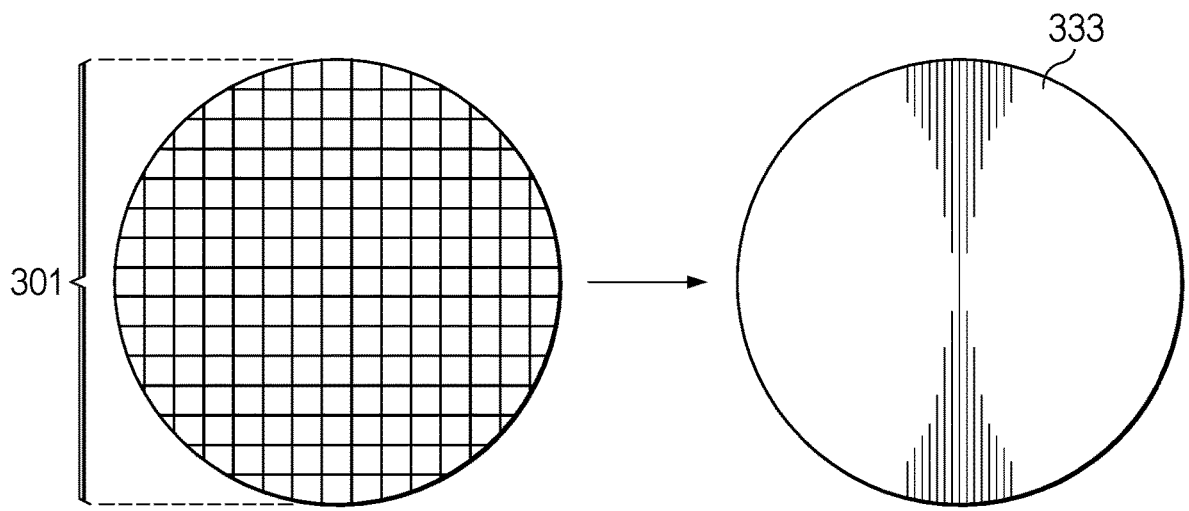
FIGS. 3B-3D illustrates some of the steps of the flow diagram of FIG. 3A that are performed prior to the use of the arrangements.

FIG. 3B illustrates in a block diagram a taper process of step 351 in FIG. 3A. In FIG. 3B, the semiconductor wafer 301 is mounted onto the backgrinding tape 333 with the device side of the semiconductor wafer 301 adhered to the backgrinding tape.

Figure 3C:
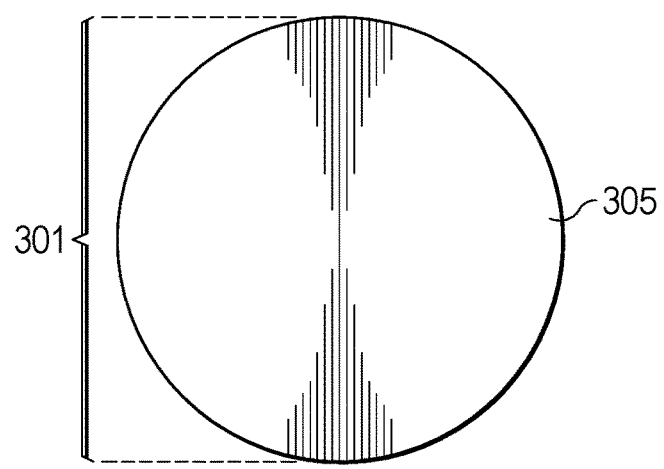

FIG. 3C illustrates the results of the backgrinding process of step 353 in FIG. 3A. In FIG. 3C, the backside surface 305 of the semiconductor wafer 301 is shown after a grinding operation polishes the semiconductor wafer. The backgrinding operation can use mechanical or chemical polishing, or a combination, such as a chemical mechanical polishing (CMP) process, to thin the semiconductor wafer 301 by removing material from the backside of the semiconductor wafer. The backgrinding process thins the semiconductor wafer 301. Prior to backgrinding, the semiconductor wafers may be as much as 750 μm thick to prevent warping during high temperature semiconductor processing and to provide mechanical support (for example, during CMP of copper conductors). By thinning the semiconductor wafers prior to packaging the semiconductor dies, the use of smaller packages, die stacking, and other small component sizes are enabled.

Figure 3D:
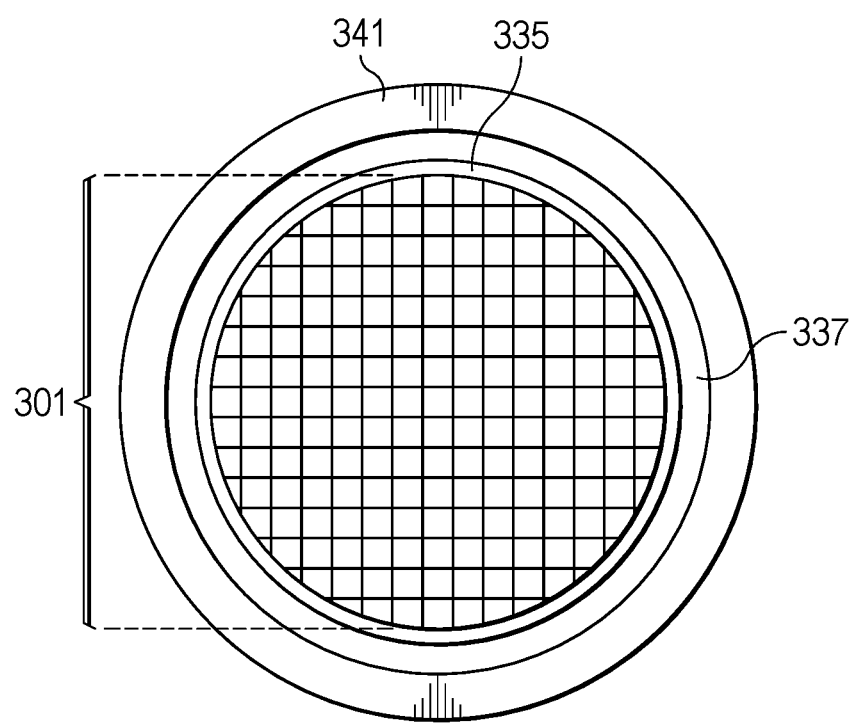

FIG. 3D illustrates the results of the dicing tape mount process of step 355 in FIG. 3A. In FIG. 3D, the semiconductor wafer 301 is shown mounted to a dicing tape 337 that is supported by a frame 341. The semiconductor wafer 301 is shown mounted over a die attach film 335 that has been previously attached to the dicing tape 337. The die attach film 335 will be used to mount the semiconductor dies to a package substrate in a semiconductor device packaging step after the dicing process singulate the semiconductor device dies from the semiconductor wafer 301. The dicing tape 337 is used in a wafer expansion process, and once that is complete the semiconductor device dies and the die attach film can be removed from the dicing tape 337.

FIGS. 4A-4F illustrate details of the dicing and singulation processes of the arrangements, including the wafer mount (355), mechanical saw (357), and wafer expansion (359) steps of FIG. 3A.

Figure 4A:
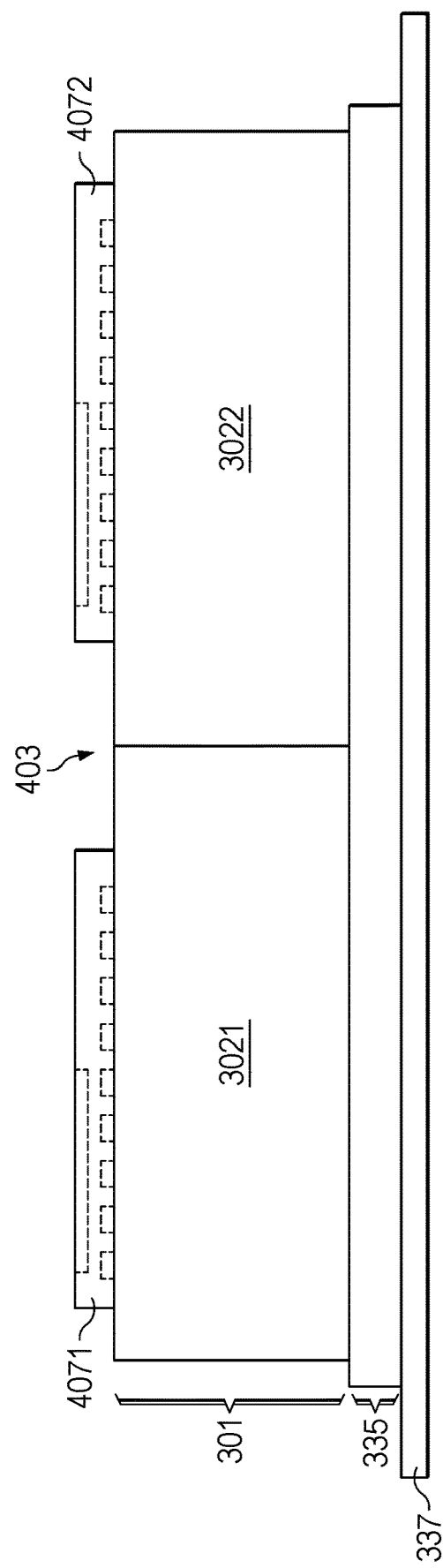
FIG. 4A illustrates, in a cross sectional view, a portion of a semiconductor wafer for use with the arrangements.

FIG. 4A illustrates in a cross-sectional view, a portion of a semiconductor wafer 301 including semiconductor dies 3021, 3022 after a wafer mount process (see step 355 in FIG. 3A) mounts the semiconductor wafer 301 to die attach film 335 on dicing tape 337. At this stage of processing, the semiconductor dies 3021 and 3022 in FIG. 4A are still part of a continuous semiconductor wafer 301, and each semiconductor die 3021, 3033 has a conductor layer 4071, 4072 that includes dielectric layers and conductor layers that form the conductive interconnections between circuitry and devices formed on the semiconductor dies. Scribe lane 403 spaces the semiconductor dies 3021, 3022 from one another to provide a space for sawing the semiconductor dies apart.

FIG. 4B illustrates, in a cross section, a mechanical sawing operation of an example arrangement, which corresponds to the mechanical saw step 357 in FIG. 3A. In FIG. 4B, the semiconductor wafer 301 is shown as a rotating saw blade cuts along a scribe lane. The saw blade can be a rotating diamond saw blade that has a blade width between 20 and 60 microns, and the scribe lane width is greater than the width of the saw blade. The saw blade in the arrangements is set to cut through either all or, or a portion of the semiconductor wafer 301, and in this example arrangement does not cut the die attach film 335. In an alternative arrangement described further below, a single pass sawing arrangement cuts through the semiconductor wafer 301 and partially cuts the die attach film 335.

Figure 4C:
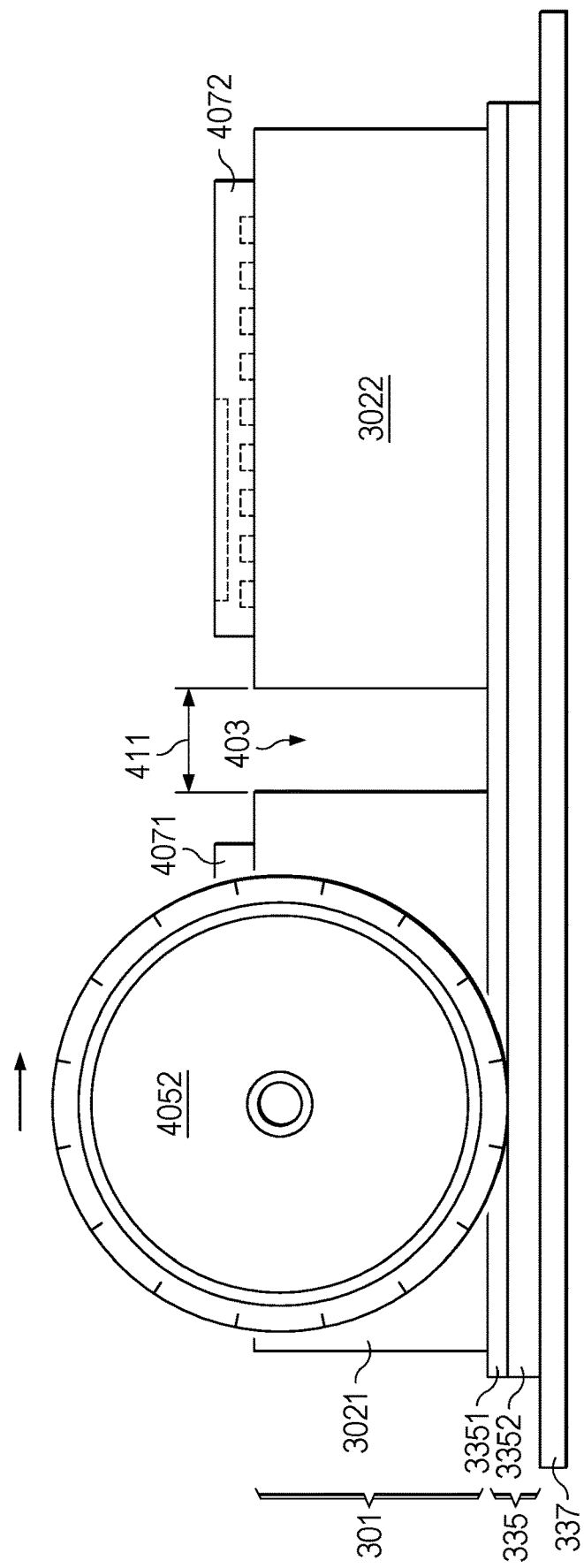

FIG. 4C illustrates, in another cross section, the semiconductor wafer 301 shown in FIG. 4B after an additional sawing operation. In this example arrangement, a two pass sawing operation is used. The first pass shown in FIG. 4A cuts through at least a portion of the semiconductor wafer using a saw blade of a first width. In some example arrangements, the first pass of FIG. 4B may cut entirely through the semiconductor wafer 301 along the scribe lanes. In other example arrangements, the first pass may cut partially through the semiconductor wafer 301. The first pass sawing operation in an example two pass sawing arrangement does not cut the die attach film 335. In FIG. 4C, the second pass of a two pass sawing operation is shown. In FIG. 4C, the cross sectional view shows an opening 411 made in scribe lane 403 from the cut in the first sawing pass. A second saw blade 4052, which in the arrangements has a second width that is less than the first width of the first saw blade, is shown in FIG. 4C as it cuts along a scribe lane. The second pass sawing operation cuts through the scribe lane deep enough to cut through any remaining semiconductor material left after the first sawing pass and makes a partial cut of the die attach film 335 along the scribe lanes. The die attach film 335 now includes a partially cut die attach film layer 3351 and an uncut die attach film layer 3352. The dicing tape 337 is shown underlying the uncut die attach film layer 3351 of the die attach film 335.

Figure 4D:
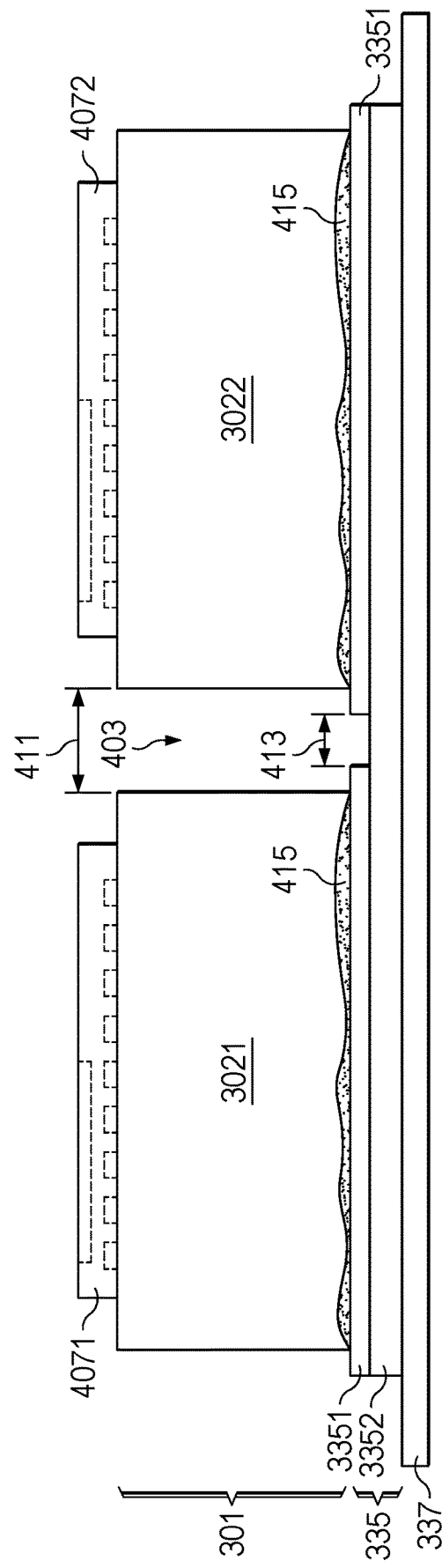

FIG. 4D illustrates, in another cross section, the semiconductor wafer 301 after the second sawing pass of a two pass sawing arrangement. In FIG. 4D, dies 3021, 3022 are separated by the first opening 411 made in the semiconductor wafer by the first sawing pass in scribe lane 403, and by a second opening 413 made by partially cutting the die attach film 335 in the second sawing pass. Because the second sawing pass uses a second blade with a width less than the width of the first blade, the second opening 413 is smaller in width than the first opening 411. The die attach film 335 now has two portions, a partially cut die attach film layer 3351, and an uncut die attach film layer 3352, overlying the dicing tape 337. The dies 3021, 3022 are still temporarily attached by the uncut die attach film layer 337 at this stage of the process. Chips or debris 415 that form when the saw cuts the backside surface of semiconductor wafer 301 (whether the arrangement cuts the semiconductor wafer 301 in a single pass, or whether the semiconductor wafer 301 is cut in the first of two passes in a double pass sawing arrangement, or in the second of the two passes, chips can form when the blade cuts through the bottom surface of the semiconductor wafer) are shown contained by the die attach film 335, so that the chips do not extend through the DAF 335.

Figure 4E:
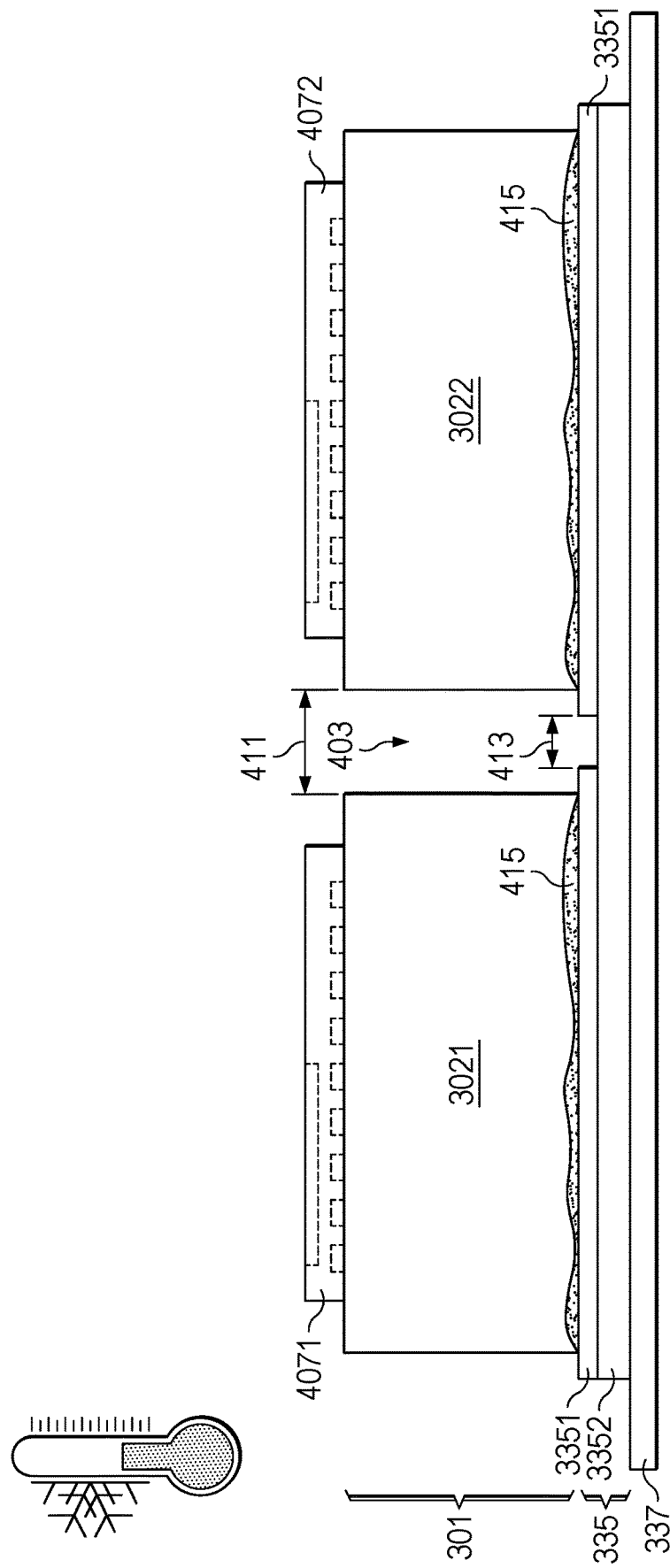

FIG. 4E illustrates, in another cross section, the semiconductor wafer 301 after the sawing process shown in FIG. 4D, in a further processing step. To begin the wafer expansion (see step 359 in FIG. 3A), the semiconductor wafer 301, including the conductor layers 4071, 4072 over the semiconductor dies 3021, 3022, the die attach film 335 and the dicing tape 337 are cooled to a temperature of below freezing, for example to a temperature of −15 degrees C. By cooling the die attach film 335, the die attach film 335 becomes brittle, which makes it easy to tear along the partial cut lines formed by the sawing operations. In an example arrangement, the cooling can be done at a wafer expansion table, for convenience.

Figure 4F:
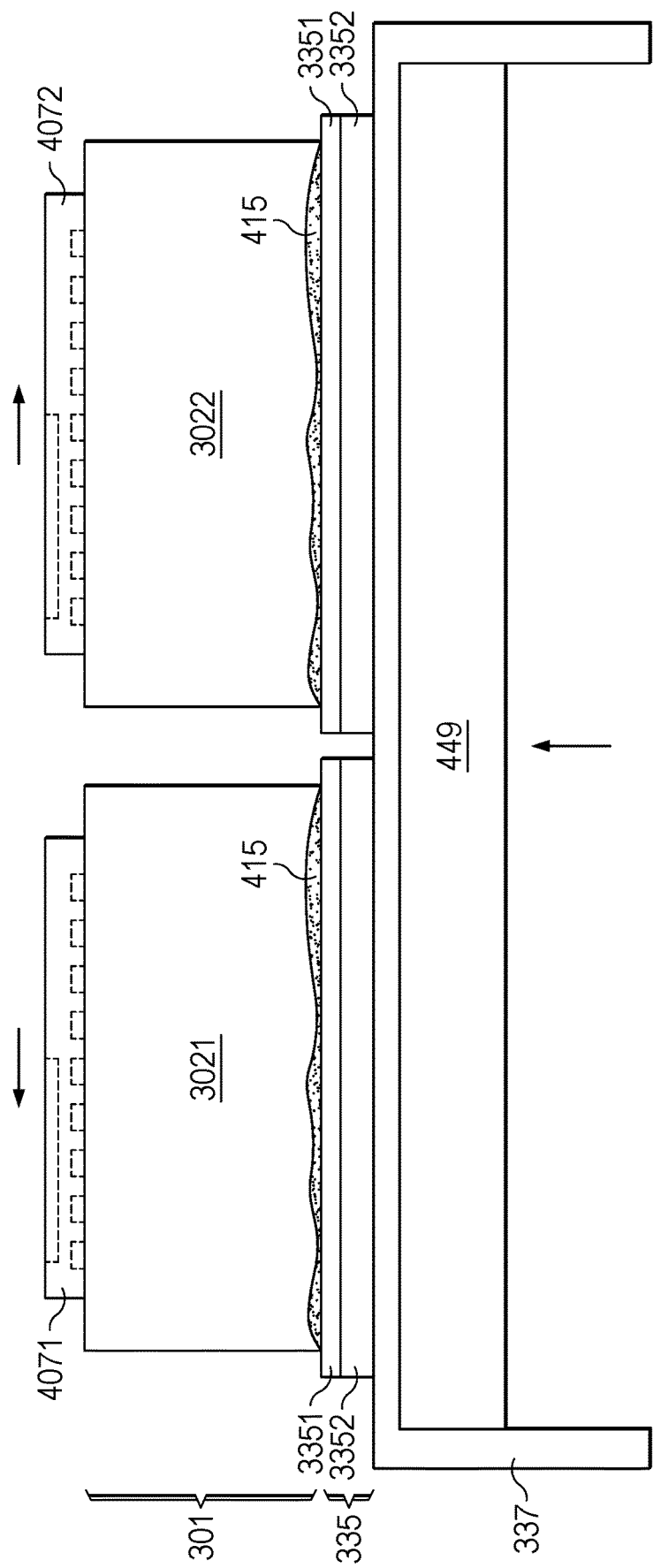

FIG. 4F illustrates how the semiconductor dies are singulated using a wafer expansion process. In FIG. 4F, the semiconductor wafer 301 is separated into dice by spreading the semiconductor wafer apart along the scribe lanes using the dicing tape 337. The ends or periphery of the dicing tape 337 are held in position while a wafer expansion table 449 pushes against the dicing tape 337 beneath the semiconductor wafer 301, by raising the table surface as shown in FIG. 4F. As the dicing tape 337 is stretched, the semiconductor dies 3021, 3022 are moved apart and the die attach film 335 will tear along the openings 413, where the partial cut lines in the scribe lane 403 were made. By spreading the now brittle die attach film 335 and tearing it along the partial cuts in the scribe lanes, the wafer expansion results in separating the semiconductor dies 3021, 3022 and the corresponding portions of die attach film 335 that are attached to the semiconductor dies one from another. Any chips 415 at the bottom of the semiconductor dies 3021, 3022, which were formed during the sawing are contained in the partially cut die attach film layer 3352 of the die attach film 335 and to ensure the chips or debris 415 not extend through the die attach film 335 to form potential shorts.

Figure 4G:
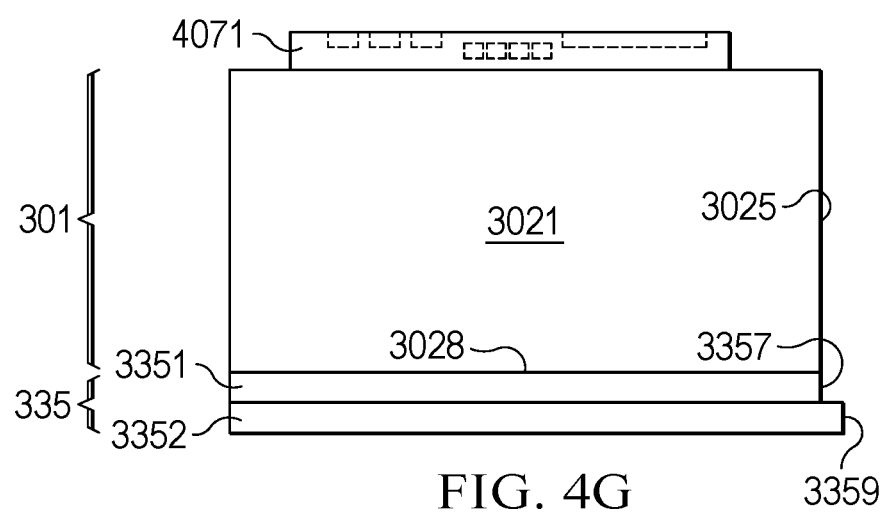

FIG. 4G illustrates in a cross sectional view additional details of the semiconductor die 3021 of FIG. 4F. After the wafer expansion separates the dies (see 3021, 3022 in FIG. 4F, and the corresponding portions of the die attach film layer 335) from one another, each die has a die attach film layer beneath it. The semiconductor die 3021, which is formed from semiconductor wafer 301, and which has a conductor layer 4071 over it, has a side edge 3025 that is a cut edge formed by the saw blade. The partially cut die attach film layer 3351 has a side edge 3357 that extends in a direction normal to the planar backside surface 3028 of the semiconductor die 3021, this cut side edge 3357 was also formed by a saw blade cut. The uncut die attach film layer 3352 has another side edge 3359 that extends in the same normal direction to the planar backside surface 3028 of the semiconductor die 3021, this uncut side edge 3359 is formed by tearing the uncut die attach film layer 3352. The partially cut die attach film layer 3351 is in contact with the planar backside surface 3028 of the semiconductor die 3021, and the uncut die attach film layer 3352 is in contact with the cut die attach film layer 3351 and spaced from the planar backside surface 3028 of the semiconductor die 3021 by the partially cut die attach film layer 3351. Because the sawing operation forms partially cut die attach film layer 3351 and uncut die attach film layer 3352, any chips that are formed when the semiconductor wafer 301 is cut by the sawing operations are contained in the partially cut die attach layer 3351 and do not extend through the die attach film layer 335, preventing shorts from forming.

Figure 5A:
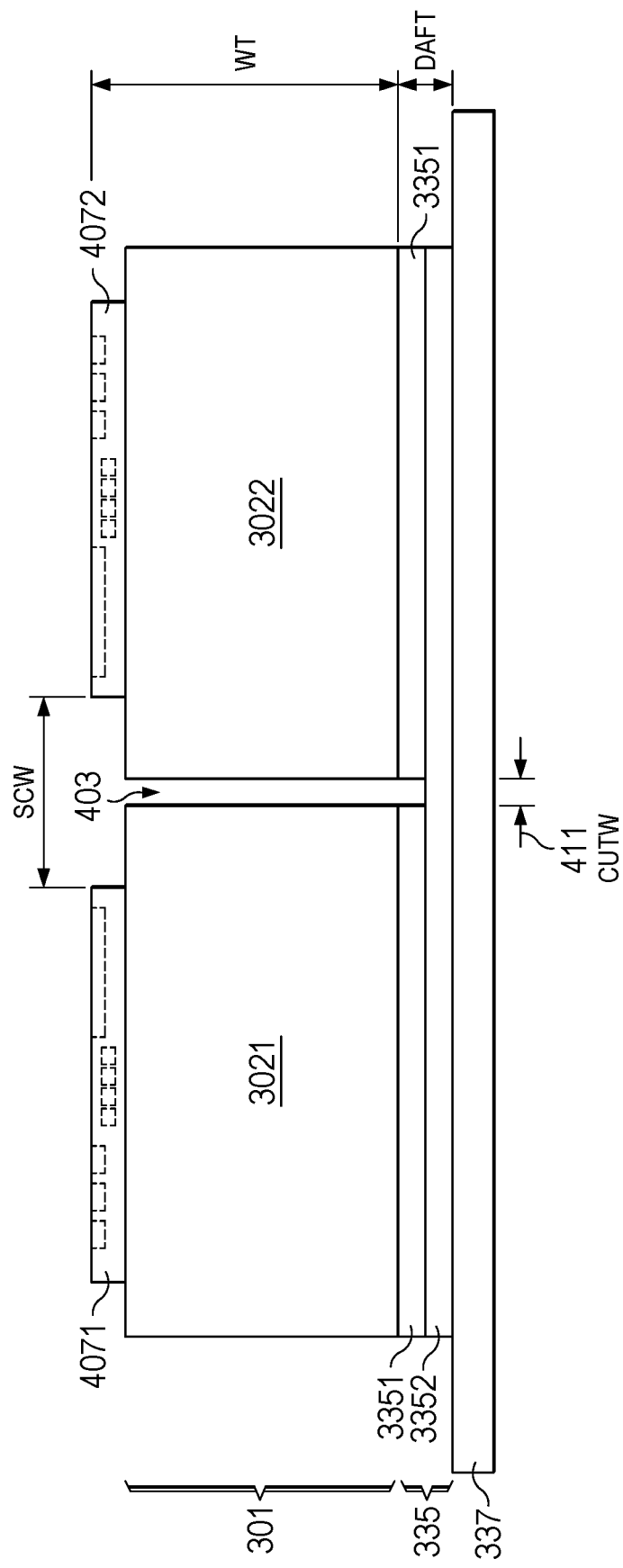
FIG. 5A illustrates in a cross-sectional view a portion of a semiconductor wafer following a sawing operation of an example arrangement.

FIGS. 5A-5E illustrate, in cross sectional views, additional aspects of semiconductor dies produced using example arrangements. FIG. 5A illustrates various dimensions of a pair of adjacent semiconductor dies 3021, 3022 after a single pass sawing operation of an arrangement. In FIG. 5A, the semiconductor wafer 301 has been cut in scribe lane 403 using a single pass sawing operation. A saw blade has passed through the semiconductor wafer 301 along scribe lane 403 and has cut though the semiconductor wafer 301 and has partially cut the die attach film layer 335 to form a partially cut die attach film layer 3351 and an uncut die attach film layer 3352. In this example, the semiconductor wafer 301 is completely severed by the single pass sawing operation. The scribe lane has a width labeled "SCW" that is at least 20 microns wide, and can be any useful width greater than the 20 micron width. The scribe lane width SCW must be greater than a saw blade thickness. In useful examples, the scribe lane width SCW should be at least 5 microns greater than the saw blade thickness. A maximum saw blade thickness for a 20 micron scribe lane width SCW would be 15 microns, as the scribe lane width increases, a greater saw blade width can be used.

The thickness of the semiconductor wafer 301, which is labeled WT, can be, for a scribe lane width SCW of 20 microns, a maximum of 300 microns. A requirement of the saw blade is that the saw blade thickness to exposure ratio is limited to 20 times, so for a 15 micron thick saw blade, the maximum thickness of the semiconductor wafer 301 is 300 microns. During the wafer backgrinding step, the semiconductor wafer 301 is thinned and thinner semiconductor wafer thicknesses can be obtained, with a minimum thickness of 50 microns. In useful examples, the post backgrinding thickness can be between 50 microns and 300 microns.

The die attach film layer 335 has a thickness labeled "DAFT" in FIG. 5A. In a useful example, the die attach film thickness DAFT can be at least 40 microns. The DAFT thickness includes the partially cut die attach film layer 3351 and the uncut die attach film layer 3352, and is of sufficient thickness to provide support during the wafer expansion process. In useful example arrangements the thickness of the partially cut DAF layer 3351 can be between 50-90 percent of the thickness DAFT, and the thickness of the uncut DAF layer 3352 can be between 10-50 percent of the thickness DAFT. The width of the opening 411, labeled "CUTW," is determined by the saw blade thickness, in an example this opening was 15 microns wide, however for greater saw blade thicknesses, the width CUTW can be larger, determined by the saw blade thickness used.

In the arrangement of FIG. 5A, a single pass sawing operation forms a partially cut die attach film layer 3351 at the same time as the opening 411 is formed in semiconductor wafer 301, and so the side edges of the partially cut die attach film layer 3351 and the semiconductor wafer 301 are coextensive as the two side edges are formed in the same sawing operation, and the width between the corresponding partially cut die attach film layers underneath the semiconductor dies 3021, 3022 corresponds to the cut width CUTW, and to the saw blade thickness.

Figure 5B:
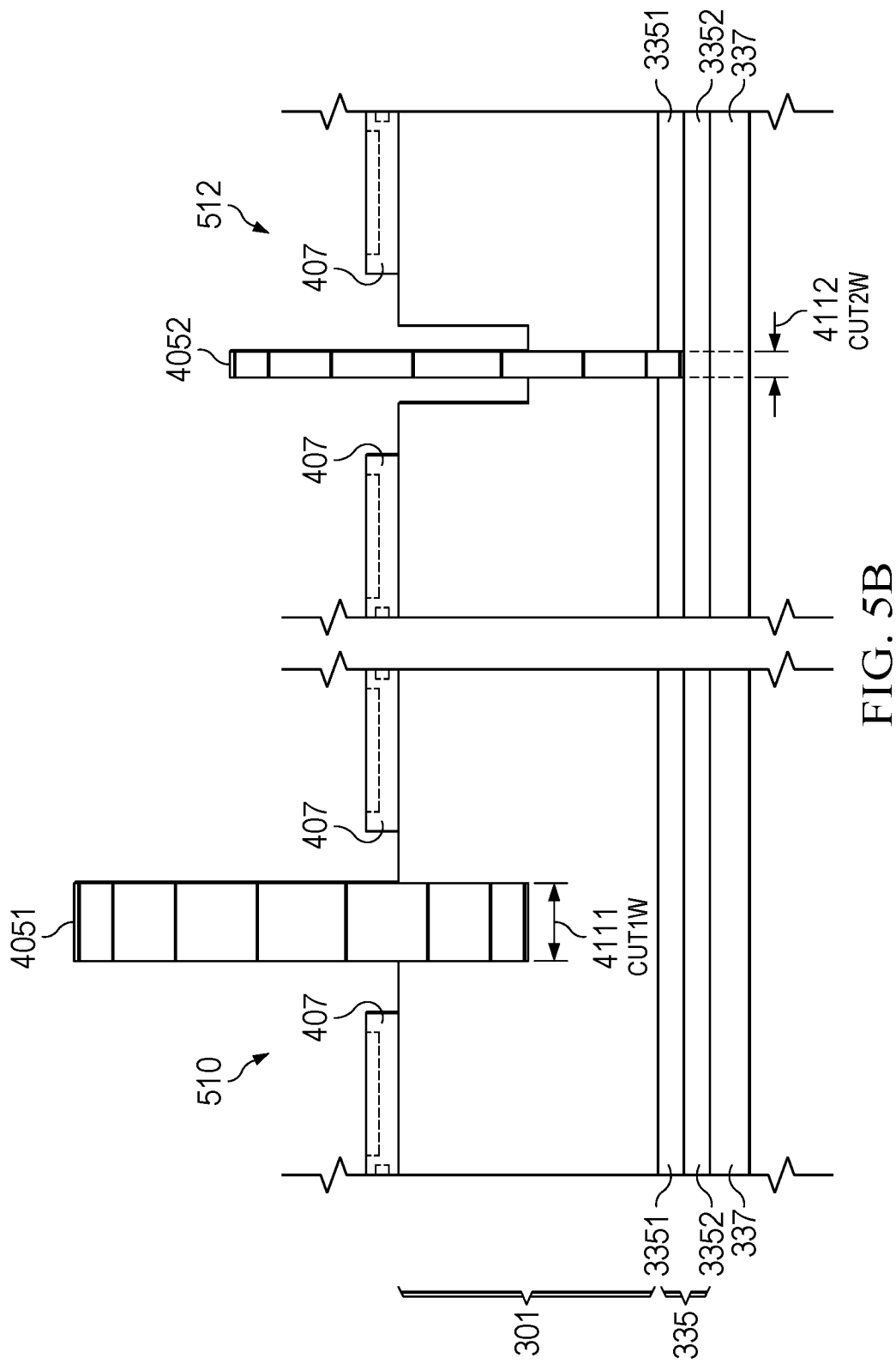
FIGS. 5B-5D illustrate, in cross-sectional views, a portion of a semiconductor wafer used with an additional arrangement for an alternative sawing operation.

FIG. 5B illustrates, in two portions of a cross sectional view, a two pass sawing operation on a semiconductor wafer 301 with a die attach film layer 335. In a first pass shown in view 510, the saw blade 4052 has a first width, for example of 15 microns, that is at least 5 microns less than a scribe lane width, in an example 20 microns. The width of the opening 4111 labeled "CUT1W" is then also 15 microns in the example. This first pass sawing operation shown in view 510 can extend into the semiconductor wafer 301 to a depth that makes a partial cut into the semiconductor wafer as shown in FIG. 5B. In an alternative approach, the first pass sawing operation in view 510 can cut through the semiconductor wafer 301, but not cut into the die attach film 335. View 510 corresponds to the first pass sawing operation of FIG. 4B described above.

In view 512, a second pass sawing operation is illustrated using a second saw blade 4052, which is also shown in FIG. 4C described above. In 512, the second pass sawing operation partially cuts into the die attach film 335, forming the partially cut die attach film layer (see 3351 in FIG. 5A, for example) and the uncut die attach film layer (see 3352 in FIG. 5A). The second pass sawing operation will also complete the cut through any remaining portion of semiconductor wafer 301 that remains after the first sawing pass (shown in view 510.) The second saw blade 4052 has a width at least 5 microns less than the first saw blade 4051, for example 10 microns where the first saw blade was 15 microns wide. The opening 4112 has a width labeled "CUT2W" corresponding to the second saw blade width, in this example 10 microns. This opening width CUT2W will also correspond to the opening width made in the partially cut die attach film layer in the scribe lanes between the semiconductor dies.

Figure 5C:
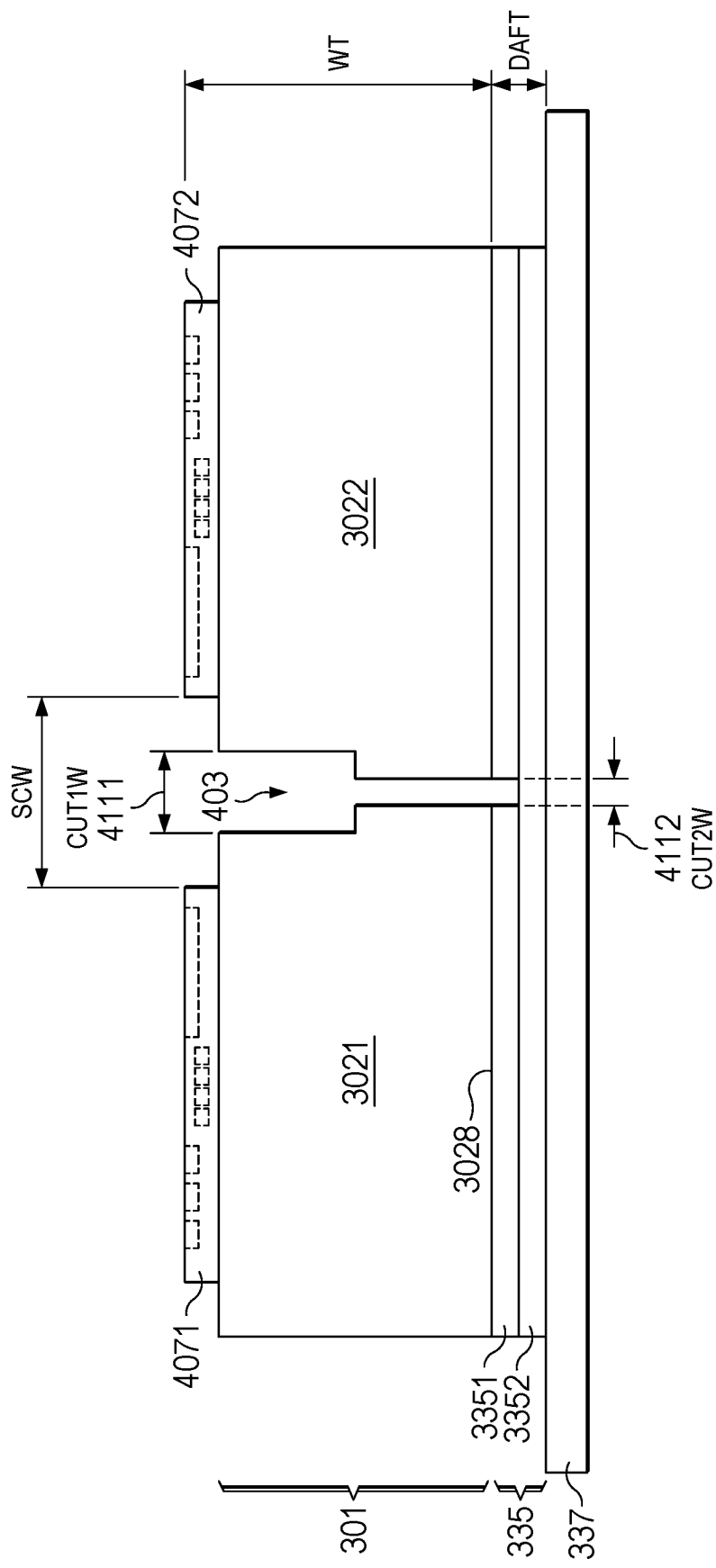

FIG. 5C illustrates, in another cross sectional view, two adjacent semiconductor dies 3021, 3022 following the two pass sawing operation on the semiconductor wafer such as is shown in FIG. 5B. In the example of FIG. 5C, the scribe lane width SCW is a bit wider than in the example of FIG. 5A, and can be at least 25 microns. The first pass sawing operation (see view 510 in FIG. 5B) uses a first blade that is at least 5 microns wider than the second blade used in the second pass (see view 512 in FIG. 5B), which has a minimum width of 15 microns. Assuming the second saw blade has a width of 15 microns, the first pass sawing operation then uses a first saw blade with a minimum width of 20 microns, which then results in a minimum scribe lane width SCW of 25 microns, to be 5 microns wider than the first pass saw blade. In FIG. 5C, the scribe lane 403 is shown after the two pass sawing operation cuts through the semiconductor wafer 301 and forms the partially cut die attach film layer 3351 in die attach film 335.

In FIG. 5C, the semiconductor wafer 301 has die attach film 335 attached to planar backside surface 3028. The first pass sawing operation, shown in view 510 in FIG. 5B, makes an opening 4111 in the scribe lane 403 of width CUT1W, for example of 20 microns, corresponding to the width of the first saw blade used (see 4051 in FIG. 5B). The first pass sawing operation can be of varied depths into the semiconductor wafer 301, and in one example can extend through the semiconductor wafer 301, stopping at the backside surface 3028. In the illustrated example, the first pass makes opening 4111 into but not extending through the semiconductor wafer 301. The sawing operation continues with a second pass, as shown in view 512 of FIG. 5B, and makes a second cut along the scribe lane 403. The second pass sawing operation makes a partial cut into the die attach film 335 and forms a partially cut die attach film layer 3351, while an uncut die attach film layer 3352 is also formed. The width of the second cut is CUT2W in FIG. 5C, and corresponds to the width of the second saw blade (see for example 4052 in FIG. 5B), and in an example can be 15 microns. The partially cut die attach film layer 3351 can have a thickness of between 50-90 percent of the overall die attach film thickness DAFT, which in an example is at least 40 microns. The uncut die attach film layer 3352 has a thickness between 10-50 percent of the overall thickness DAFT. The semiconductor dies 3021 and 3022 each have a conductor layer 4071, 4072 overlying the device side surface, and these are spaced by the scribe lane width SCW. After the two pass sawing operation, the two semiconductor dies are kept in place by the uncut die attach film layer 3352, and by the dicing tape 337.

Figure 5D:
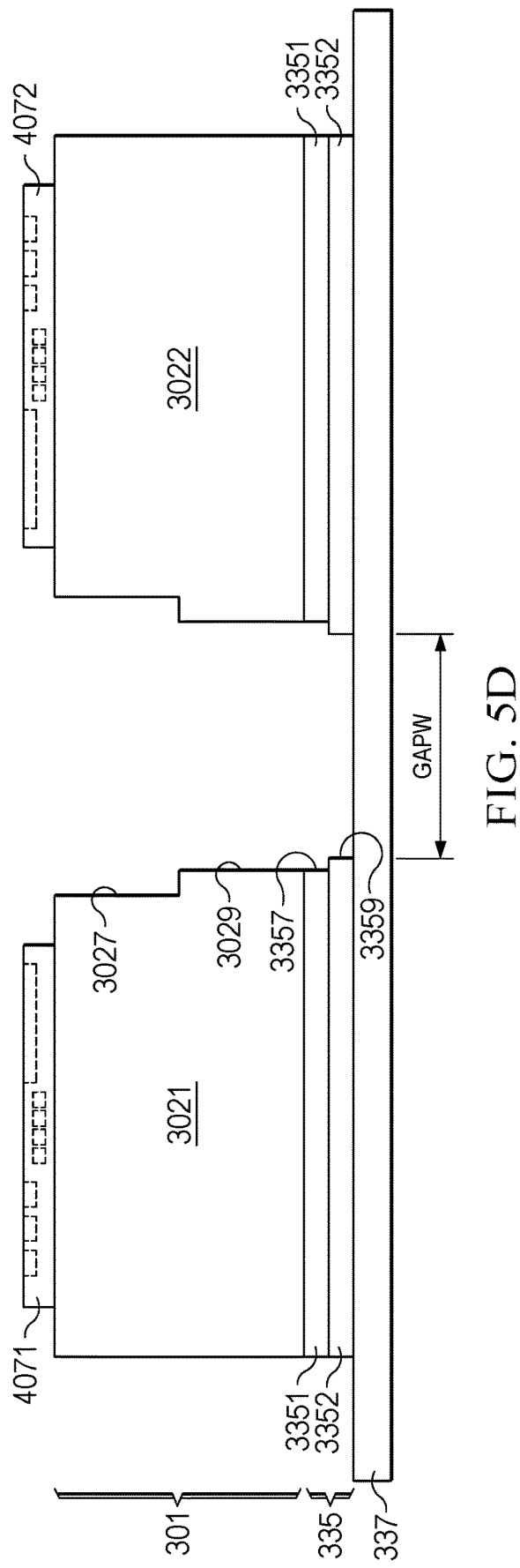

FIG. 5D illustrates in another cross sectional view the semiconductor wafer 301 of FIG. 5C after a wafer expansion step (see 359 in FIG. 3A). In FIG. 5D, certain features of the semiconductor die 3021 that result from the two pass sawing operation are shown. The semiconductor die 3021 has a first side edge 3027 that is a sawn or cut edge that is formed when the first pass sawing operation is performed (see view 510 in FIG. 5B). The semiconductor die 3021 has a second side edge 3029 that is also a cut or sawn edge that is formed when the second sawing operation cuts along the scribe lane 403 and makes the second (narrower) cut through the semiconductor wafer 301 and forms the partially cut DAF layer 3351. The partially cut DAF layer 3351 also has a side edge 3357 that is formed along with the side edge 3357 of semiconductor die 3021 by the second sawing operation, and these two side edges 3357 and 3359 will be, as a result of being formed by the same sawing operation, coextensive in the horizontal direction as the elements are oriented in FIG. 5D. The uncut die attach film layer 3352 has a side edge 3359 that is a torn edge, not cut, that is formed by the wafer expansion process of the arrangements. After the wafer expansion process is performed, a gap with width labeled "GAPW" is formed between adjacent semiconductor dies, such as semiconductor dies 3021, 3022 in FIG. 5D. The gap width GAPW can be of any width greater than zero, and when the gap extends through the uncut die attach film layer 3352 the wafer expansion is successful. In experiments the semiconductor dies formed using the arrangements separated successfully after the uncut die attach film layer 3352 was cooled to a temperature of −15 degrees C., and the wafer expansion was then performed. In useful examples, the cooling temperature can be between −40 degrees C. and the ambient temperature, and preferably between −20 degrees C. and −5 degrees C.; the type of die attach film used and the size of the semiconductor dies determines the best temperature range, and this can easily be determined in simple experiments. The dicing tape 337 stretches but remains attached, providing mechanical support to the singulated semiconductor dies 3021, 3022 and holding the dies in place for additional processing.

After the wafer expansion steps are completed, the semiconductor dies are processed as shown in FIGS. 2C-2G and described above to form packaged semiconductor devices that include the semiconductor dies, and that are electrically coupled to leads on package substrates, such as a conductive lead frame, to form the electrical connections and terminals for the packaged semiconductor devices.

Figure 6A:
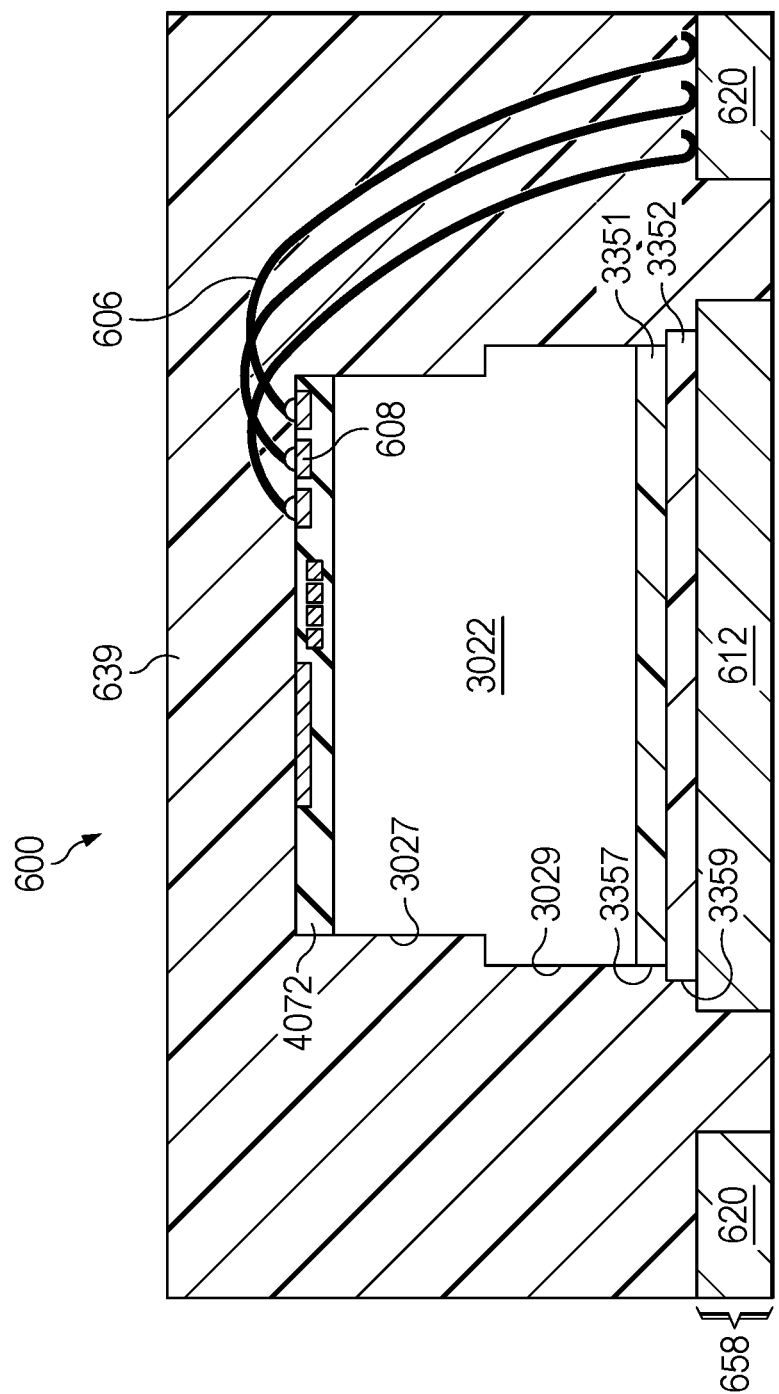
FIGS. 6A-6B illustrate, in additional cross sectional views, example packaged semiconductor devices formed using the arrangements.

FIG. 6A illustrates, in a cross sectional view, a packaged semiconductor device 600 formed using the two pass sawing operations of an example arrangement. Following the wafer expansion process, the semiconductor dies 3021, 3022 of FIG. 5D are mounted on a package substrate, and wire bonding, molding and package singulation are performed as shown in FIGS. 2C-2G and described above. In FIG. 6, a conductive lead frame 658 is used as a package substrate for a quad flat no-lead package formed using mold compound 639. The mold compound 639 partially covers the lead frame 658, with leads 620 remaining exposed from the mold compound 639 to form terminals for the packaged semiconductor device 600. In the illustrated example, the die pad 612 is also exposed from the mold compound 639, forming a thermal pad for the packaged semiconductor device 600 when the packaged semiconductor device 600 is mounted to a system board. Bond wires 606 couple bond pads 608 on the conductor layer 4072 of semiconductor die 3022 to the leads 620. The bond wires 606 can be copper, gold, aluminum, or palladium plated copper (PCC) bond wires. Ribbon bonds or other electrical connections can be used.

The side edges of the semiconductor die 3022 that were formed in the sawing operations (see views 510, 512 in FIG. 5B), as are shown in FIG. 5D, are also shown in the packaged semiconductor device 600 of FIG. 6. The semiconductor die 3022 has first side edge 3027 that is a cut edge formed in the first sawing operation. The semiconductor die 3022 has second side edge 3029 that extends from the first side edge 3027, the side edge 3029 is also a cut edge formed by the second sawing operation. The partially cut die attach film layer 3351 has a side edge 3357 that is cut by the second sawing operation. The uncut die attach film layer 3352 has a side edge 3359 that is a torn edge formed by the wafer expansion operation. These side edges are in contact with the mold compound 639. As the elements are oriented in the cross sectional view of FIG. 6, the side edges are vertical. The side edges are normal to the planar backside surface of the semiconductor die 3022. As the packaged semiconductor device 600 is oriented in FIG. 6A the side edges are vertical. Because the second side edge 3029 of the semiconductor die 3022, and the side edge 3357 of the partially cut die attach film layer 3357 are formed in the same second pass sawing operation, the side edges are coextensive.

Figure 6B:
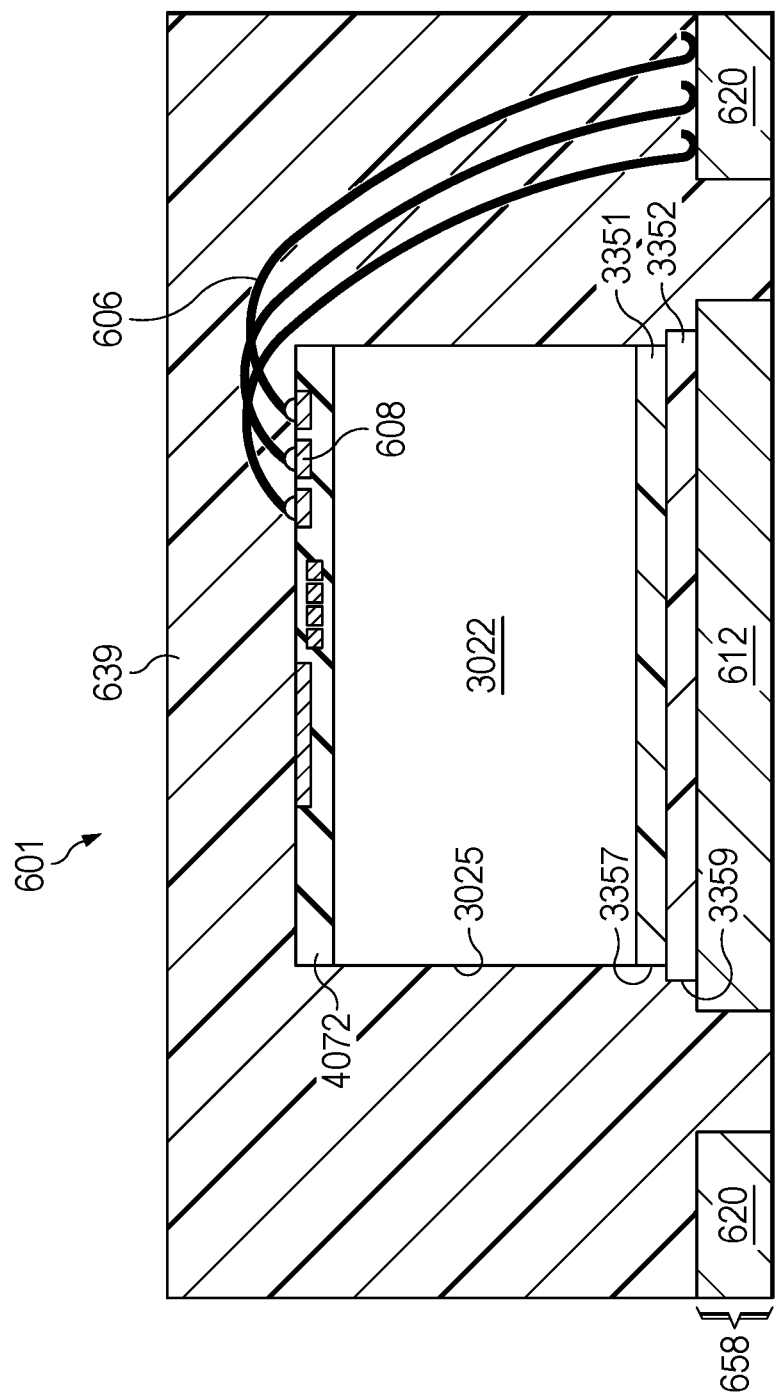

FIG. 6B illustrates, in another cross section, a packaged semiconductor device 601 formed using a single pass sawing operation of the arrangements. In FIG. 6B, the packaged semiconductor device 601 includes semiconductor die 3022, mounted on die pad 612 of a package substrate (lead frame 658 in this example). The leads 620 and die pad 612 are partially exposed from the mold compound 639, which covers part of the package substrate (lead frame 658), the bond wires 606, and the semiconductor die 3022. The semiconductor die 3022 has a side edge 3025 that is a cut side edge formed by the sawing operation. The partially cut die attach film layer 3351 has a side edge 3357 that is cut by the same sawing operation, and the side edge 3025 of the semiconductor die 3022, and the side edge 3357 of the partially cut die attach film layer 3351 are coextensive, being formed during the same sawing operation. Uncut die attach film layer 3352 has a side edge 3359 that is a torn edge, formed during the wafer expansion process.

Use of the arrangements has been shown experimentally to eliminate or substantially prevent shorts in packaged semiconductor devices due to the presence of semiconductor chips extending through the die attach film layer. The uncut die attach film layer formed in the sawing operations of the arrangements acts as a die isolation barrier, containing any semiconductor chips away from the die pad when the semiconductor devices are mounted to package substrates, preventing electrical paths and the corresponding current leakage that can occur when the arrangements are not used.

Modifications are possible in the described arrangements, and other alternative arrangements are possible within the scope of the claims.

What is claimed is:

1. A method for packaging electronic devices, comprising:
    forming semiconductor devices on a device side surface of a semiconductor wafer, the semiconductor devices spaced for one another by scribe lanes on the semiconductor wafer;
    mounting the semiconductor wafer on a die attach film over a dicing tape, the die attach film contacting a backside surface of the semiconductor wafer that is opposite the device side surface;

cutting through at least a portion of the semiconductor wafer in the scribe lanes;
partially cutting through the die attach film along the scribe lanes, forming a cut die attach film layer lying over an uncut die attach film layer; and
separating the semiconductor devices from one another, the semiconductor devices including a corresponding portion of the die attach film on the backside surfaces, the corresponding portion of the die attach film having the cut die attach film layer with cut side edges, and the uncut die attach film layer with torn side edges.

2. The method of claim 1, wherein cutting through at least a portion of the semiconductor wafer in the scribe lanes further comprises:
cutting at least a portion of the semiconductor wafer with a first blade having a first width; and
cutting the remaining portion of the semiconductor wafer and a portion of the die attach film with a second blade having a second width that is less than the first thickness to form the cut die attach film layer and an uncut die attach film layer along the scribe lanes.

3. The method of claim 2, wherein cutting at least a portion of the semiconductor wafer further comprises cutting an entire thickness of the semiconductor wafer with the first blade, without cutting the die attach film with the first blade.

4. The method of claim 2, wherein stretching the dicing tape further comprises:
cooling the dicing tape, the semiconductor wafer and the die attach film to a temperature less than 0 degrees C.; and
pulling the dicing tape to expand the dicing tape, the uncut die attach film layer tearing along the scribe lanes to allow the semiconductor devices and corresponding portions of the die attach film attached to the semiconductor devices to separate from one another.

5. The method of claim 4, wherein pulling the dicing tape to expand the dicing tape cause the uncut die attach film layer to form a torn side edge in the uncut die attach film layer underlying the cut side edge of the partially cut die attach film layer.

6. The method of claim 4, and further comprising:
mounting the semiconductor devices with the die attach film on a package substrate using the die attach film to adhere the semiconductor devices to the package substrate, the package substrate carrying an array of semiconductor devices, the semiconductor devices spaced from one another on the package substrate by saw streets;
electrically coupling bond pads on the semiconductor devices to leads on the package substrate;
covering the semiconductor devices and portions of the package substrate with mold compound; and
sawing through the mold compound and the package substrate along the saw streets to separate the packaged semiconductor devices one from another.

7. The method of claim 2, wherein cutting comprises sawing using a rotating mechanical blade.

8. The method of claim 2, wherein cutting at least a portion of the semiconductor wafer forms a cut side edge on semiconductor dies formed in the semiconductor wafer, and partially cutting the die attach film forms a cut side edge on the partially cut die attach film layer.

9. A method for packaging a semiconductor device, comprising:
mounting a backside surface of a semiconductor wafer to a die attach film layer on a dicing tape, the semiconductor wafer having semiconductor dies formed on a device side surface opposite the backside surface;
cutting the semiconductor wafer along scribe lanes on a device side surface of a semiconductor wafer, the scribe lanes separating individual semiconductor dies formed in the semiconductor wafer one from another;
partially cutting the die attach film layer along the scribe lanes forming a cut die attach film layer overlying an uncut die attach film layer;
cooling the die attach film layer, the semiconductor wafer, and the dicing tape to a temperature of between −40 degrees C. and 0 degrees C.;
stretching the dicing tape causing the uncut die attach film layer to tear along the scribe lanes between the semiconductor dies, allowing a gap to form between the semiconductor dies and a corresponding portion of the die attach film attached to the semiconductor dies to singulate the semiconductor dies and the corresponding portion of die attach film one from another;
using the die attach film, mounting the semiconductor dies to die pads of a conductive lead frame;
electrically coupling bond pads of the semiconductor dies to conductive leads on the lead frames using bond wires or ribbon bonds;
covering the semiconductor dies, the bond wires or ribbon bonds, and a portion of the conductive lead frame with mold compound, the leads of the conductive lead frame partially exposed from the mold compound to form terminals; and
sawing the mold compound and the lead frame apart in saw streets between the semiconductor dies to form the packaged semiconductor devices.

10. The method of claim 9, wherein cutting the semiconductor wafer and partially cutting the die attach film further comprises cutting through the semiconductor wafer using a single saw blade to form a single cut that extends through the semiconductor wafer and into the die attach film layer to form the cut die attach film layer and the uncut die attach film layer.

11. The method of claim 9, wherein cutting the semiconductor wafer and partially cutting the die attach film further comprises:
in a first sawing operation, cutting at least a portion of the semiconductor wafer along the scribe lanes using a first blade having a first width; and
in a second sawing operation, cutting through any remaining portion of the semiconductor wafer along the scribe lanes using a second blade having a second width that is less than the first width and cutting into the die attach film layer underlying the backside surface of the semiconductor wafer to form the cut die attach film layer and the uncut die attach film layer.

12. The method of claim 11, wherein in the first sawing operation, the first blade cuts through the semiconductor wafer but does not cut the die attach film layer, and the second blade partially cuts the die attach film layer to form the cut die attach film layer and the uncut die attach film layer.

13. The method of claim 9, wherein cooling further comprises cooling the semiconductor wafer, the die attach film and the dicing tape to a temperature of about −15 degrees C.

14. A method for packaging electronic devices, comprising:

forming semiconductor devices on a device side surface of a semiconductor wafer, the semiconductor devices spaced for one another by scribe lanes on the semiconductor wafer;

mounting the semiconductor wafer on a die attach film over a dicing tape, the die attach film contacting a backside surface of the semiconductor wafer that is opposite the device side surface;

cutting through at least a portion of the semiconductor wafer;

partially cutting through the die attach film forming a cut die attach film layer lying over an uncut die attach film layer; and separating the semiconductor devices from one another, and after separation, the semiconductor devices including a corresponding portion the die attach film having the cut die attach film layer with a first side edge, and a corresponding portion of the uncut die attach film layer with a second side edge, the first side edge different from the second side edge in surface roughness.

15. The method of claim 14, wherein the first side edge is a cut side as a result of a mechanical saw.

16. The method of claim 14, wherein the second side edge is a torn side as a result of stretching to separate the semiconductor devices from one another.

\* \* \* \* \*